US007221239B2

(12) United States Patent
Runyon

(10) Patent No.: US 7,221,239 B2

(45) **Date of Patent: *May 22, 2007**

(54) VARIABLE POWER DIVIDER

(75) Inventor: Donald L. Runyon, Duluth, GA (US)

(73) Assignee: Andrew Corporation, Norcross, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/865,737

(22) Filed: Jun. 10, 2004

(65) Prior Publication Data

US 2005/0017822 A1 Jan. 27, 2005

Related U.S. Application Data

(63) Continuation of application No. 10/290,838, filed on Nov. 8, 2002, now Pat. No. 6,788,165.

(51) Int. Cl.
*H01P 5/22* (2006.01)
*H03H 7/18* (2006.01)

(52) U.S. Cl. ....................................... 333/117; 333/111

(58) Field of Classification Search ................ 333/109, 333/111, 113, 116, 119, 156, 159, 117; 342/372; 455/276.1

See application file for complete search history.

(56) References Cited

U.S. PATENT DOCUMENTS 3,656,179 A 4/1972 De Loach .................. 333/161
3,769,610 A 10/1973 Savarin et al. .............. 333/111
4,160,976 A 7/1979 Conroy ................ 343/700 MS
4,348,676 A 9/1982 Tom ........................... 342/420
4,485,362 A 11/1984 Campi et al. ............... 333/128
4,517,570 A 5/1985 Gray, Jr. ..................... 343/372
4,602,227 A 7/1986 Clark et al. ................. 333/109
4,636,755 A 1/1987 Gibbs ......................... 333/116
4,788,515 A 11/1988 Wong et al. ................ 333/160
4,814,775 A 3/1989 Raab et al. ................. 342/373
4,841,262 A 6/1989 Lomangino (Continued)

FOREIGN PATENT DOCUMENTS

EP 1 054 466 A2 11/2000

(Continued)

OTHER PUBLICATIONS

International Search Report dated Jan. 24, 2003 for PCT/US02/26766.

Mills, B.Y., Aitchison, R.E., Little, A.G. and McAdam, W.B.; "The Sydney University Cross-type Radio Telescope" *Proceedings of the I.R.E. Australia* (Feb. 1963).

International Search Report dated Apr. 3, 2003 for PCT/US02/35983.

*Primary Examiner*—Dean Takaoka

(74) *Attorney, Agent, or Firm*—Michael J. Mehrman; Mehrman Law Office PC

(57) ABSTRACT

A variable power divider and method can vary the RF power between ports in a high power and multi-carrier RF environment, such as is used in controlling signals sent and received in a base station antenna. The variable power divider can include a single-control phase shifter and a hybrid power divider. The single-control phase shifter can comprise a three-port device having a single input port and two output ports. The single-control phase shifter can further comprise a variable adjuster that can change or adjust the phase between two RF signals. The hybrid power divider can comprise a four-port device having two input ports and two output ports. Both the single-control phase shifter and the hybrid power divider can comprise substantially planar structures that are suitable for high-speed manufacturing. The output ports of the hybrid power divider can be coupled to various devices such antennas or power absorbing elements.

34 Claims, 10 Drawing Sheets

U.S. PATENT DOCUMENTS

| | | | | |
|---|---|---|---|---|
| 4,968,956 | A | 11/1990 | Huang | 332/145 |
| 5,075,648 | A | 12/1991 | Roberts et al. | 333/128 |
| 5,162,803 | A | 11/1992 | Chen | 342/372 |
| 5,210,542 | A | 5/1993 | Pett et al. | 343/700 MS |
| 5,343,173 | A | 8/1994 | Balodis et al. | 333/126 |
| 5,473,294 | A | 12/1995 | Mizzoni et al. | 333/113 |
| 5,512,914 | A | 4/1996 | Hadzoglou et al. | 343/816 |
| 5,523,764 | A | 6/1996 | Martinez et al. | 342/372 |
| 5,563,558 | A | 10/1996 | Mohwinkel et al. | 333/127 |
| 5,585,769 | A | 12/1996 | Mazzochette | 333/156 |
| 5,714,961 | A | 2/1998 | Kot et al. | 343/769 |
| 5,798,675 | A | 8/1998 | Drach | 333/161 |
| 5,798,734 | A | 8/1998 | Ohtsuka et al. | 343/700 MS |
| 5,861,848 | A | 1/1999 | Iwasaki | 343/700 MS |
| 5,917,455 | A | 6/1999 | Huynh et al. | 343/792.5 |
| 5,940,030 | A | 8/1999 | Hampel et al. | 342/372 |
| 5,949,303 | A | 9/1999 | Arvidsson et al. | 333/136 |
| 5,949,370 | A | 9/1999 | Smith et al. | 342/354 |
| 5,973,641 | A | 10/1999 | Smith et al. | 342/372 |
| 5,995,047 | A | 11/1999 | Freyssinier et al. | 343/700 MS |
| 6,005,522 | A | 12/1999 | Arias et al. | 343/700 MS |
| 6,069,529 | A | 5/2000 | Evans | 330/124 D |
| 6,091,311 | A | 7/2000 | Waters | 333/161 |
| 6,097,267 | A | 8/2000 | Hampel | 333/128 |
| 6,118,379 | A | 9/2000 | Kodukula et al. | 340/572.8 |
| 6,198,458 | B1 | 3/2001 | Heinz et al. | 343/853 |
| 6,208,222 | B1 | 3/2001 | Sinsky | 333/161 |
| 6,219,002 | B1 | 4/2001 | Lim | 343/769 |
| 6,278,410 | B1 | 8/2001 | Soliman et al. | 343/769 |
| 6,292,143 | B1 | 9/2001 | Romanofsky | 343/700 MS |
| 6,333,683 | B1 | 12/2001 | Hampel | 333/161 |
| 6,346,924 | B1 | 2/2002 | Heinz et al. | 343/853 |
| 6,421,023 | B1 | 7/2002 | Phelan | 343/700 MS |
| 6,441,700 | B2 | 8/2002 | Xu | 342/383 |
| 6,441,785 | B1 | 8/2002 | Rosen et al. | 342/383 |
| 6,816,668 | B2 | 11/2004 | McDonald et al. | 392/375 |
| 6,850,130 | B1 * | 2/2005 | Gottl et al. | 333/161 |
| 6,864,837 | B2 * | 3/2005 | Runyon et al. | 342/372 |
| 6,922,169 | B2 * | 7/2005 | Moh'd Izzat et al. | 342/360 |
| 2002/0113750 | A1 | 8/2002 | Heinz et al. | 343/853 |
| 2003/0076198 | A1 * | 4/2003 | Phillips et al. | 333/161 |
| 2005/0046514 | A1 * | 3/2005 | Janoschka | 333/156 |

FOREIGN PATENT DOCUMENTS

| | | | |
|---|---|---|---|
| EP | 1 239 534 | | 11/2002 |
| EP | 1 239 535 | | 11/2002 |
| EP | 1 239 538 | | 11/2002 |
| GB | 817 740 | | 8/1959 |
| GB | 1 314 693 | | 4/1973 |
| GB | 2171864 | A | 2/1986 |
| JP | 62082801 | A | 4/1987 |
| JP | 01268209 | | 10/1989 |
| JP | 04 000902 | A | 1/1992 |
| JP | 04000902 | | 1/1992 |
| JP | 5-121915 | | 5/1993 |
| JP | 05037222 | | 12/1993 |
| JP | 07183717 | | 12/1993 |
| JP | 8-102601 | | 4/1996 |
| JP | 09148801 | | 6/1997 |
| JP | 09214211 | | 8/1997 |
| JP | 09246845 | | 9/1997 |
| JP | 09246846 | | 9/1997 |
| JP | 10013103 | | 1/1998 |
| JP | 11-298212 | | 10/1999 |
| JP | 2000-196302 | A | 7/2000 |
| JP | 2001-196804 | | 7/2001 |
| JP | 2002-33603 | A | 2/2002 |
| WO | WO 95/10862 | | 4/1995 |
| WO | WO 96/14670 | | 5/1996 |
| WO | WO 01/13459 | | 2/2001 |
| WO | WO 01/13459 | A1 | 2/2001 |
| WO | WO 02/05383 | | 1/2002 |
| WO | WO 03/019720 | A1 | 3/2003 |

* cited by examiner

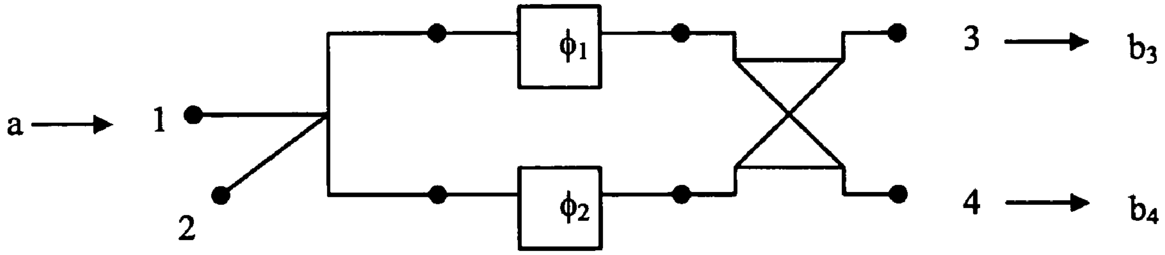

Parameter Limits (Port 1 Input)

| | State 0 | State 1 |
|---|---|---|
| $\phi_1$ | 0° | 90° |
| $\phi_2$ | 90° | 0° |
| $\Delta\phi$ | -90° | 90° |
| $\lvert b_3 \rvert$ | 0 | a |
| $\lvert b_4 \rvert$ | a | 0 |

$$b_3 = ae^{-j\frac{1}{2}\left(\phi_1+\phi_2+\frac{\pi}{2}\right)}\cos\left(\frac{\Delta\phi}{2}-\frac{\pi}{4}\right)$$

$$b_4 = ae^{-j\frac{1}{2}\left(\phi_1+\phi_2+\frac{\pi}{2}\right)}\cos\left(\frac{\Delta\phi}{2}+\frac{\pi}{4}\right)$$

$$= -ae^{-j\frac{1}{2}\left(\phi_1+\phi_2+\frac{\pi}{2}\right)}\sin\left(\frac{\Delta\phi}{2}-\frac{\pi}{4}\right)$$

$$\Delta\phi = \phi_1 - \phi_2$$

*FIG. 1*

*Conventional Art*

Parameter Limits (Port 1 Input)

| | State 0 | State 1 |
|---|---|---|
| $\phi_1$ | 0° | 180° |
| $\phi_2$ | 0° | 0° |
| $\Delta\phi$ | 0° | 180° |
| $\lvert b_3 \rvert$ | 0 | a |
| $\lvert b_4 \rvert$ | a | 0 |

$$b_3 = ae^{-j\frac{1}{2}(\phi_1+\phi_2+\pi)}\sin\left(\frac{\Delta\phi}{2}\right)$$

$$b_4 = ae^{-j\frac{1}{2}(\phi_1+\phi_2+\pi)}\cos\left(\frac{\Delta\phi}{2}\right)$$

$$\Delta\phi = \phi_1 - \phi_2$$

Parameter Limits (Port 1 Input)

| | State 0 | State 1 |
|---|---|---|
| $\phi_1$ | 0° | 180° |
| $\phi_2$ | 0° | 0° |
| $\Delta\phi$ | 0° | 180° |
| $\lvert b_3 \rvert$ | a | 0 |
| $\lvert b_4 \rvert$ | 0 | a |

$$b_3 = e^{-j\frac{1}{2}(\phi_1+\phi_2)} \cos\left(\frac{\Delta\phi}{2}\right)$$

$$b_4 = e^{-j\frac{1}{2}(\phi_1+\phi_2+\pi)} \sin\left(\frac{\Delta\phi}{2}\right)$$

$$\Delta\phi = \phi_1 - \phi_2$$

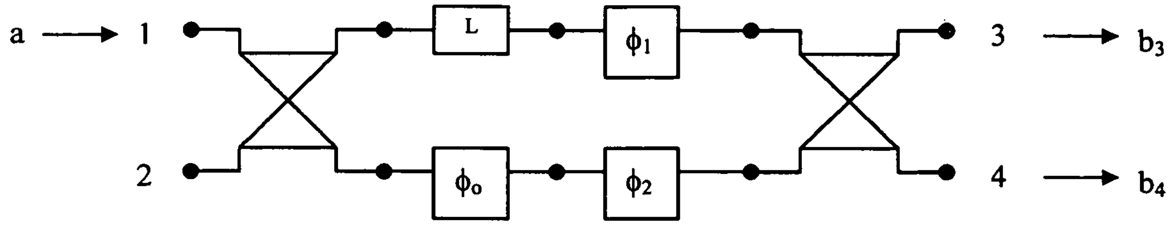

Parameter Limits (Port 1 Input)

| | State 0 | State 1 |
|---|---|---|
| $\phi_1$ | 0° | 90° |
| $\phi_2$ | 90° | 0° |
| $\Delta\phi$ | -90° | 90° |
| $\lvert b_3 \rvert$ | 0 | a |
| $\lvert b_4 \rvert$ | a | 0 |

$$b_3 = ae^{-j\frac{1}{2}\left(\phi_1+\phi_2+\frac{\pi}{2}\right)}\cos\left(\frac{\Delta\phi}{2}-\frac{\pi}{4}\right)$$

$$b_4 = ae^{-j\frac{1}{2}\left(\phi_1+\phi_2+\frac{\pi}{2}\right)}\cos\left(\frac{\Delta\phi}{2}+\frac{\pi}{4}\right)$$

$$= -ae^{-j\frac{1}{2}\left(\phi_1+\phi_2+\frac{\pi}{2}\right)}\sin\left(\frac{\Delta\phi}{2}-\frac{\pi}{4}\right)$$

$$\Delta\phi = \phi_1 - \phi_2$$

*FIG. 4*
*Conventional Art*

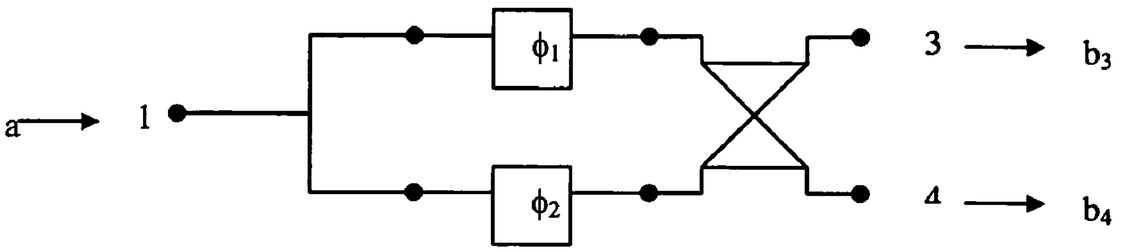

Parameter Limits (Port 1 Input)

| | State 0 | State 1 |
|---|---|---|
| $\phi_1$ | 0° | 90° |
| $\phi_2$ | 90° | 0° |
| $\Delta\phi$ | -90° | 90° |
| $\lvert b_3 \rvert$ | 0 | a |
| $\lvert b_4 \rvert$ | a | 0 |

$$b_3 = ae^{-j\frac{1}{2}\left(\phi_1+\phi_2+\frac{\pi}{2}\right)}\cos\left(\frac{\Delta\phi}{2}-\frac{\pi}{4}\right)$$

$$b_4 = ae^{-j\frac{1}{2}\left(\phi_1+\phi_2+\frac{\pi}{2}\right)}\cos\left(\frac{\Delta\phi}{2}+\frac{\pi}{4}\right)$$

$$= -ae^{-j\frac{1}{2}\left(\phi_1+\phi_2+\frac{\pi}{2}\right)}\sin\left(\frac{\Delta\phi}{2}-\frac{\pi}{4}\right)$$

$$\Delta\phi = \phi_1 - \phi_2$$

*FIG. 5*
*Conventional Art*

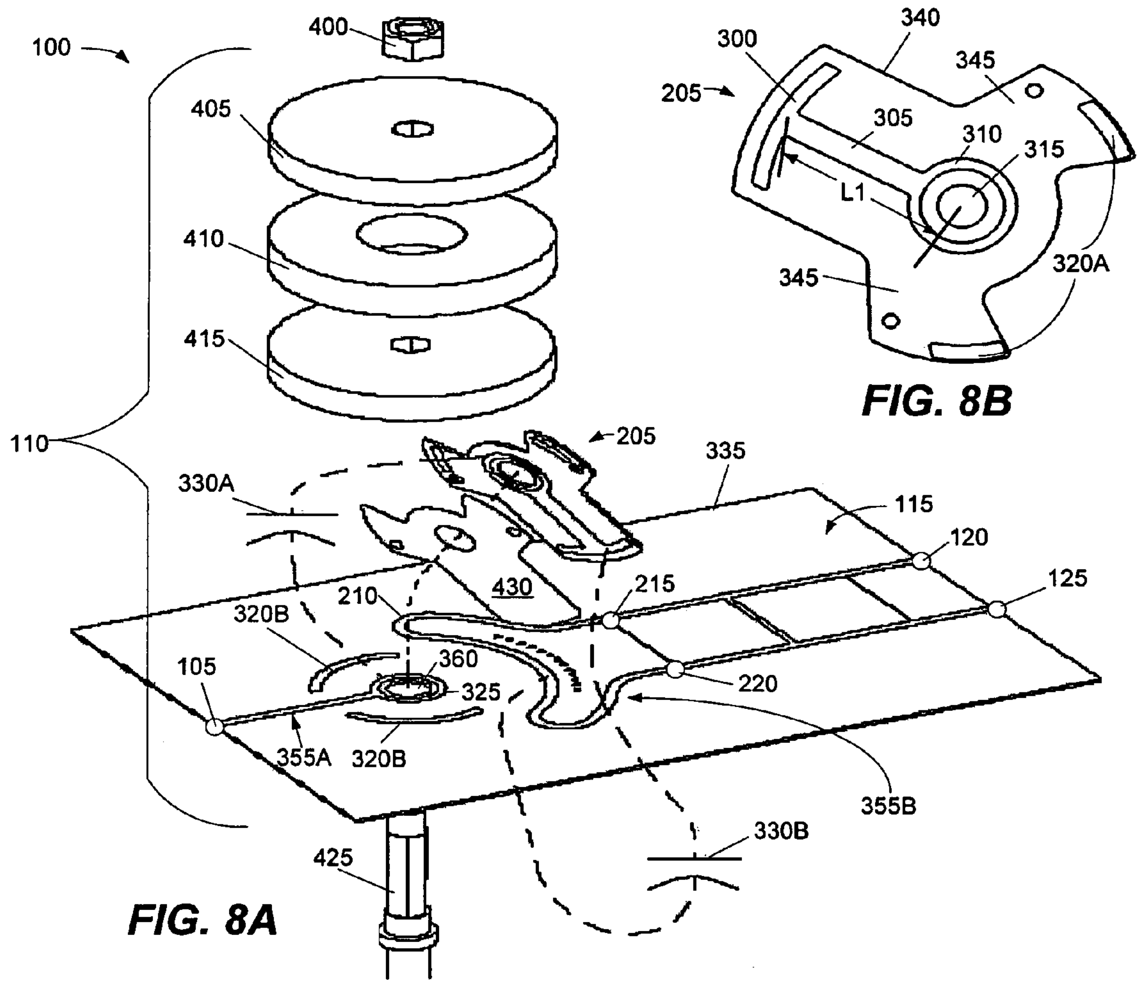
FIG. 8B
FIG. 8A
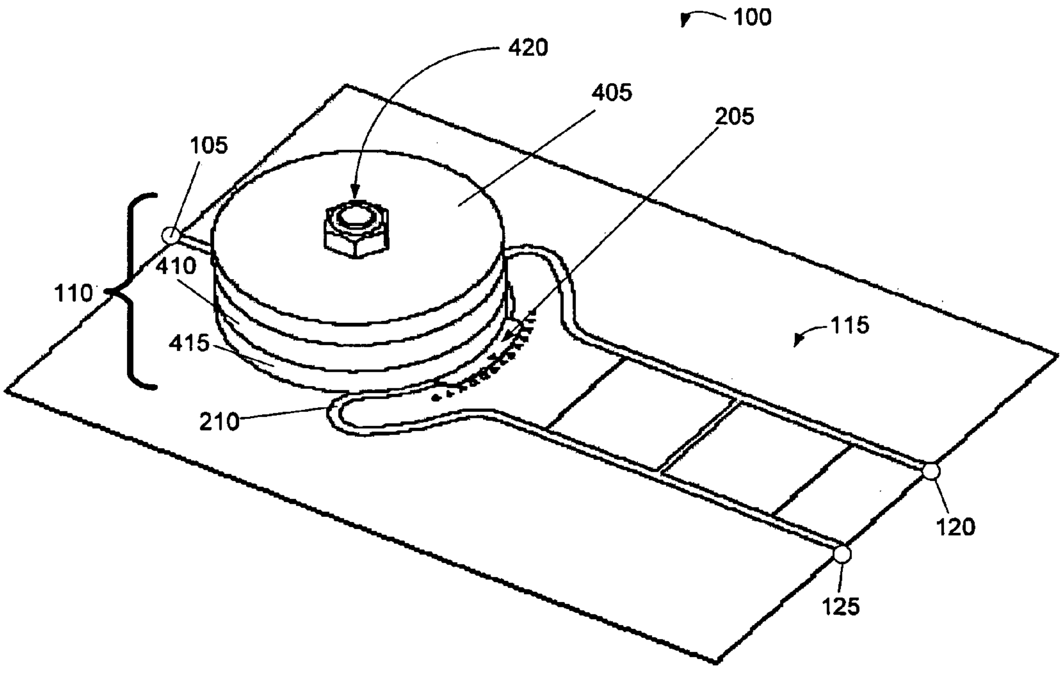
FIG. 9

VARIABLE POWER DIVIDER

STATEMENT REGARDING RELATED APPLICATIONS

This application is a continuation of and claims priority to application Ser. No. 10/290,838 filed Nov. 8, 2002, now U.S. Pat. No. 6,788,165 entitled "VARIABLE POWER DIVIDER," the entire contents of which are incorporated by reference.

FIELD OF THE INVENTION

This invention relates generally to wireless communication systems using passive networks, and more particularly, to a planar variable power divider with low passive intermodulation for use on printed circuit boards to convert a single input RF signal into two output RF signals of constant phase throughout the adjustment range but with variable amplitudes as a function of movement of a single phase shifter that is part of the variable power divider.

BACKGROUND OF THE INVENTION

A large class of microwave components can be formed by combining two phase shifters and two fixed power dividers (combiners). The fact that both of these components may be made to operate over broad frequency bands at relatively high RF power levels has made this general structure useful in constructing variable power dividers, switches, and fixed circulators for active electronic warfare and beamforming in antenna applications for communication satellites and radar.

General Discussion of Conventional Technology

FIGS. 1 through 5 illustrates five conventional configurations incorporating two phase shifters and two fixed power dividers to function as variable power dividers and switches. FIGS. 1 through 4 illustrates networks having four ports and FIG. 5 illustrates a network having three ports. Other networks exist having three or four ports, and networks having greater numbers of ports can be realized with fixed power dividers having greater numbers of ports and additional phase shifters. Networks having greater numbers of ports can be realized using networks having three or four ports as building blocks. The three or four port configurations presented in FIGS. 1 through 5 can be realized as either switches (having two states) or variable power dividers (having a continuum of states).

In the case of a switch, only two values of phase shift (and therefore two states) are available: those phase settings corresponding to state 0 and state 1. For the variable power divider, the setting of phase shifters $\phi_1$ and $\phi_2$ may vary continuously over a predetermined range of values. The use of phase shifter pairs having unlike insertion phases will result in different phase values for state 0 and state 1 than the ones shown. The use of phase shifters with nonreciprocal phase properties will result in different phase values corresponding to the forward (transmit) or reverse (receive) signal propagation through the device. Four port circulators can be made using the configurations in FIG. 1 through 4 comprised of four external ports with fixed phase states when the phase shifters have nonreciprocal phase properties.

The configuration illustrated in FIG. 1 uses a zero degree/one-hundred-eighty degrees hybrid power divider and a quadrature (zero degree/ninety degrees) hybrid power divider. The output voltage signals, $b_3$ and $b_4$, at Ports 3 and 4 described by the equations in FIG. 1 correspond to an input signal at Port 1. The input signal at Port 1 provides in-phase signals of equal amplitude to the variable phase shifters $\phi_1$ and $\phi_2$. Ideally no signal appears at Port 2 when a signal is applied to Port 1, and Port 2 can be described as the "isolated port" for signals applied to Port 1. Similarly, a signal applied to Port 2 does not appear at Port 1. The phase difference, $\Delta\phi=\Delta\phi_1-\phi_2$, is the controlling parameter for the output signal amplitudes at Ports 3 and 4 and the sum of the two phase values can vary the output signals phase. The sum of the two phase values must be equal to a constant phase value throughout the range of adjustment for the output signals to have a constant phase value.

Simultaneously altering the phase values in a complementary fashion can accomplish variable power divider output signal amplitude variation while maintaining a relatively constant output signal phase values throughout the range of adjustment. The variable power divider function of varying the output signal amplitudes can be accomplished by varying the phase value of one phase shifter while the phase of the other phase shifter remains at a fixed value. The output signals phase values are substantially a constant quantity only when the phase quantity ($\phi_1+\phi_2$) is substantially equal to a constant value throughout the range of adjustment.

The range of phase values to control the signal amplitudes between the switch states for the configuration illustrated in FIG. 1 is ninety degrees. The table in FIG. 1 identifies the phase values for $\phi_1$ and $\phi_2$ where $\Delta\phi=-90$ degrees for switch State 0 and $\Delta\phi=+90$ degrees for switch State 1. State 0 corresponds to the condition where ideally all of the available signal input to Port 1 appears at Port 4. State 1 corresponds to the condition where ideally all of the available signal input to Port 1 appears at Port 3. Values of the $\phi_1$ and $\phi_2$ phase values in the table greater than zero represents a greater phase delay relative to the zero degree value for signals input to phase shifters $\phi_1$ and $\phi_2$ having identical phase values.

In other words, $\phi_1=0$ degrees and $\phi_2=90$ degrees is a condition where the signal output from $\phi_2$ is delayed 90 degrees relative to the signal output from $\phi_1$. In other words, $\phi_1=0$ degrees and $\phi_2=90$ degrees is a condition where the signal output from $\phi_2$ lags 90 the signal output from $\phi_1$ by 90 degrees. The insertion loss of the phase control devices can be minimized when the phase control devices have the minimum range of phase adjustment corresponding to the desired range of amplitude adjustment The configuration of FIG. 5 having three external ports is the same as FIG. 1 except the input divider does not have the isolated Port 2 and the input divider consequently is a reactive type power divider and not a hybrid power divider. The operation of the configuration in FIG. 5 is identical to that of FIG. 1.

The configuration illustrated in FIG. 2 uses two quadrature hybrid power dividers as compared to the mixed hybrid configuration illustrated in FIG. 1. The range of phase values to control the signal amplitudes between the switch states in FIG. 2 is one-hundred-eighty degrees and the insertion loss of the phase shifters can be greater than the configuration in FIG. 1.

The configuration illustrated in FIG. 3 uses zero degree/one-hundred-eighty degrees hybrid power dividers rather than mixed hybrids (FIG. 1) or quadrature hybrids (FIG. 2). In this configuration, one-hundred-eighty degrees of phase shift is required of each phase shifter. The output signals at Ports 3 and 4 have phase values that are different by ninety degrees.

The configuration of FIG. 4 is the same as FIG. 2 with an additional fixed phase delay, $\phi_o$, and a length of transmission line, L, so the two signal phases coincide at the input to the respective variable phase shifters $\phi_1$ and $\phi_2$. This configuration has the same overall functionality as the configuration in FIG. 1.

Specific Discussion of Conventional Technology

U.S. Pat. No. 4,485,362 to Campi et al. teaches a three-port, variable microwave stripline power divider that has a variable output over a wide range at one output without appreciably changing the power output at the other output, but which requires electronic patch devices and circuitry to vary the power split.

U.S. Pat. No. 5,473,294 to Mizzoni et al. teaches a planar variable power divider but which requires use of two quadrature hybrids and two variable phase shifters, and uses waveguide, not microstrip technology, and requires use of two sliding mechanisms to close the four hybrid output circuits. The block diagram for Mizzoni et al. conforms to FIG. 4 knowing that the quadrature hybrids with sliding shorts as described by Mizzoni et al. are well known in the art as being two port phase shifters.

A variable power divider operated in reverse becomes a variable power combiner whereby two input signals are combined into a single output signal at a predetermined power level. Such a combiner is as taught in U.S. Pat. No. 6,069,529 to Evans, where a variable power combiner is used as a redundancy switch to provide amplified signal backup in the event of a failed first amplifier. However, it uses a waveguide path, requires active amplifier circuitry, and a mechanical apparatus within the hybrid comprising a movable coupling plate that is replaceable with a metal wall. Such a design is costly and adds complexity to its manufacture. The design is also characterized by reduced reliability, while also being limited to waveguide medium applications.

Japanese Patent No. 4000902 by Asao et al. teaches a planar variable power distributor implemented in stripline technology having a block diagram that conforms to FIG. 1 with the exception that it has two isolated ports instead of the one isolated port (2) in FIG. 1. The fixed input divider is a "rat-race" or "ring" hybrid comprising five ports and the in-phase port is used as the input (1) to the variable power distributor. The two isolated ports are terminated with absorbing loads. The parallel lines between the input in-phase hybrid divider and the quadrature divider are covered in part with two diamond-shaped dielectrics.

Moving the dielectrics in tandem in the direction transverse to the direction of the parallel lines results in differential and complementary phase shifts on the two lines. The design has varying amounts of dielectric material in close proximity to fixed width transmission line conductors. The impedance of the transmission lines will change along with the phase shift unless some other geometric parameter such as separation distances between the two ground planes and the transmission lines simultaneously vary.

Problems in Conventional Art

The variable power dividers of the conventional art have required more than one phase shifter to achieve output signals with substantially constant phases throughout the adjustment range, have been limited to use with the more costly waveguide transmission medium, or have relied on use of complex mechanical apparatus as part of the hybrid network. Even the one stripline power divider to Campi et al. requires the connection of various contact points between a patch member and ground to effectuate discreet power splits between two outputs, which themselves are required to be two planar patch members.

Accordingly, a need exists in the art for a variable power divider in which the output signals can be easily controlled, either locally or remotely, by a simple, single movable part. A need further exists for a variable power divider suitable for planar construction on a printed circuit board using microstrip or strip line transmission lines, having a single input port and two output ports where the two output signals are variable in amplitude and with phases that are substantially a constant quantity throughout the adjustment range, and the constant output signal phases are either substantially equal or different by a fixed value.

Another need exists for a variable power divider in which the variable amplitudes of the output signals is accomplished by means of a single moveable part that varies the phase of the input signal in two signal paths, and that single moveable part may be operated locally or remotely.

There is a further need in the art to provide a variable power divider that is suitable for planar construction on a printed circuit board and used with microstrip or stripline transmission paths on the printed circuit board.

And lastly, another need exists to produce a variable power divider that is easily constructed, of low cost, adaptable to common printed circuit board manufacturing techniques, highly reliable by its simplicity of component parts and easily variable and repeatable signal outputs.

SUMMARY OF THE INVENTION

The present invention solves the aforementioned problems with a variable power divider and method that can vary the RF power between ports in a high power and multi-carrier RF environment, such as is used in controlling signals sent and received in a base station antenna. The variable power divider can comprise a single-control phase shifter and a hybrid power divider.

The single-control phase shifter is a three-port device having a single input port and two output ports. The single-control phase shifter of the present invention is reciprocal and therefore, a circulator function, as taught in the conventional art, cannot be realized with this invention. The single-control phase shifter can further comprise a variable adjuster that can change or adjust the phase between two RF signals. Specifically, the variable adjuster can change the phase between two RF signals propagating along two electrical paths by changing the electrical lengths of the paths relative to each other. In this way, a sum of a first phase of a first RF signal and a second phase of a second RF signal can be maintained to be substantially equal to a constant as measured at the output ports of the three port phase shifter.

The single-control phase shifter can propagate RF signals between contactless conductive structures in order to substantially reduce passive intermodulation. Specifically, the variable adjuster of the single-control phase shifter can capacitively couple RF signals between non-contacting conductive structures. The variable adjuster can comprise a moveable first electrical path that can be rotated and capacitively coupled to various positions along a second electrical path that propagates received RF signals in opposite directions relative to one another.

However, the present invention is not limited to this specific mechanical structure of a first electrical path that can be rotated and capacitively coupled to various positions along a second electrical path. Other phase shifter structures can include, but are not limited to, capacitively coupled sliding sleeves, moving dielectrics in tandem, waveguides, and other similar structures that have three ports and can impart phase shifts between RF signals such that a sum of the phase shift values substantially equals a constant quantity throughout the range of adjustment.

Meanwhile, the hybrid power divider is a four port device having two input ports and two output ports and the hybrid power divider is reciprocal. The hybrid power divider manipulates both the phase and amplitude of the RF signals received at its input ports. The hybrid power divider can substantially isolate the input RF signal flow between the input ports. Since very little signal flow occurs between the two input ports, predominate RF signal flow in the hybrid power divider is from the input ports to the output ports.

The RF signal amplitudes at the two output ports of the phase shifter corresponding to the RF signal from one input port usually have a substantially equal amplitude. The RF signal phase values at the two output ports of the hybrid power divider corresponding to the RF signal from one of the input ports of the hybrid power divider can differ by substantially ninety or one-hundred-eighty degrees. There can be two signals at each output port of the hybrid power divider when there is one signal applied to each of the input ports of the hybrid power divider.

The addition of the two RF signals at each output port of the hybrid power divider can provide a resultant RF signal with amplitude and phase that is dependent on the relative signal amplitudes and phases of the input RF signals. The phase of each input RF signal can be adjusted such that each phase of a respective output RF signal is substantially equal to a constant value throughout the range of adjustment. Furthermore, the phase of each input RF signal can be adjusted such that each phase of a respective output RF signal is substantially equal to a constant value while the relative amplitude values of the output RF signals are varied. The variable power divider of the present invention is specific to the output signal phase values that are substantially a constant quantity throughout the adjustment range of the phase shifter.

According to one exemplary embodiment, the phase of a first RF signal at a first output port and the phase of a second RF signal at a second output port of the hybrid power divider are substantially equal. According to another exemplary embodiment, a phase difference of substantially a constant amount exists between a first RF signal at a first output port of the hybrid power divider and a second RF signal at a second output port of the hybrid power divider.

Both the single-control phase shifter and the hybrid power divider can comprise substantially planar structures that are suitable for high-speed manufacturing environments that can substantially reduce manufacturing costs. Specifically, both the single-control phase shifter and the hybrid power divider can be made from substantially planar printed circuit board materials.

The output ports of the variable power divider can be coupled to various devices. According to one exemplary aspect of the invention, the variable power divider output ports can be coupled directly or indirectly to antenna elements of an antenna array to vary an antenna radiation characteristic. According to another exemplary aspect of the present invention, the variable power divider can be coupled to two RF signal paths and operated with two states and function as a RF switch to route the RF input signal to substantially one output port and to the respective signal path. According to another exemplary aspect of the present invention, one of the output ports can be coupled to a RF power absorbing element. In this way the variable power divider can function as a variable power attenuator since one output port can dissipate RF energy usually in the form of heat while the other output port propagates the RF energy to another device that conserves RF energy such as an antenna.

The phase shifter of the variable power divider can be moved with an actuator that can comprise an electromechanical device such as an electric motor. The actuator can be coupled to a remote controller through a control link that may comprise a wireless or cable type of communications medium. The remote controller can comprise a computer running software that determines how the much the phase shifter should be adjusted in order to control the power distribution at the outputs of the hybrid power divider.

BRIEF DESCRIPTION OF THE DRAWINGS

FIG. 1 illustrates a variable power divider of the conventional art comprising a zero degree/one-hundred-eighty degrees hybrid divider, two separate variable phase shifters, and a quadrature (zero degree/ninety degrees) hybrid divider.

FIG. 4 illustrates a variable power divider of the conventional art comprising two quadrature (zero degree/ninety degrees) hybrid power dividers, a fixed phase offset, a transmission line length, and two separate variable phase shifters.

FIG. 5 illustrates a variable power divider of the conventional art comprising a reactive power divider, two variable phase shifters that are coupled to a quadrature (zero degree/ninety degrees) hybrid power divider.

FIG. 8A is an illustration showing a single wiper element for two output ports of an exemplary microstrip variable phase shifter according to one exemplary embodiment of the present invention.

FIG. 8B is an illustration showing a bottom view of the single wiper element illustrated in FIG. 8A.

FIG. 9 is an illustration showing an isometric view of an assembled variable power divider according to an exemplary embodiment of the present invention.

DETAILED DESCRIPTION OF THE EXEMPLARY EMBODIMENTS

Figure 2:
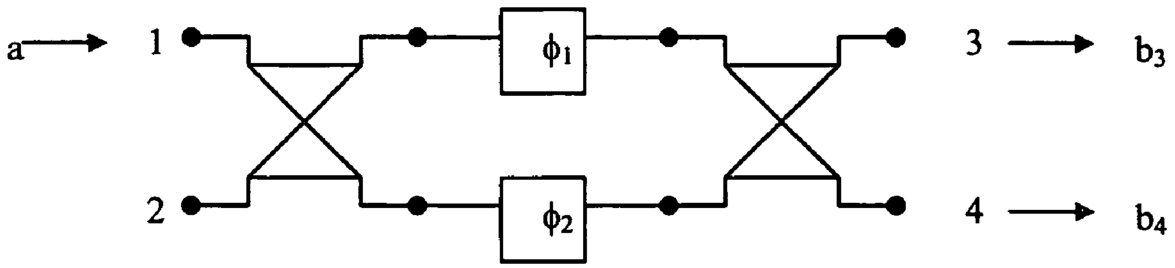
FIG. 2 Conventional Art
FIG. 2 illustrates a variable power divider of the conventional art comprising two quadrature (zero degree/ninety degrees) hybrid dividers and two separate variable phase shifters.
Figure 3:
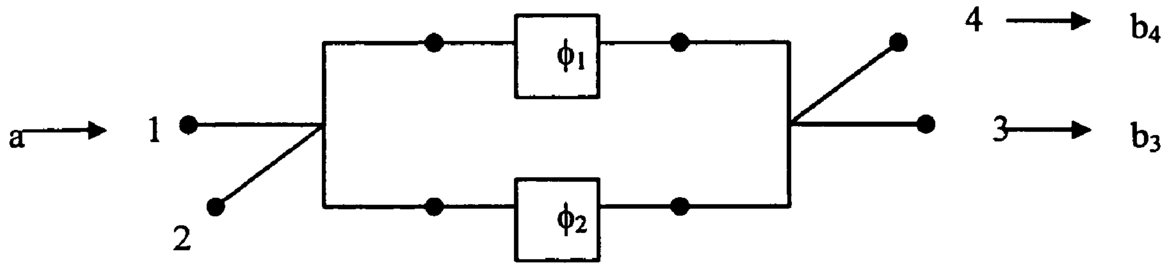
FIG. 3 Conventional Art
FIG. 3 illustrates a variable power divider of the conventional art comprising two zero degree/one-hundred-eighty degrees hybrid power dividers and two separate variable phase shifters.

The variable power divider and method can vary RF power between ports in a high power and multi-carrier RF environment, such as is used in controlling signals sent and received in a base station antenna. The variable power divider can comprise a single-control phase shifter and a hybrid power divider such as a zero degree/ninety degrees or zero degree/one-hundred-eighty degrees hybrid power divider.

Referring now to the drawings, in which like numerals represent like elements throughout the several figures, aspects of the present invention and the illustrative operating environment will be described.

Figure 6:
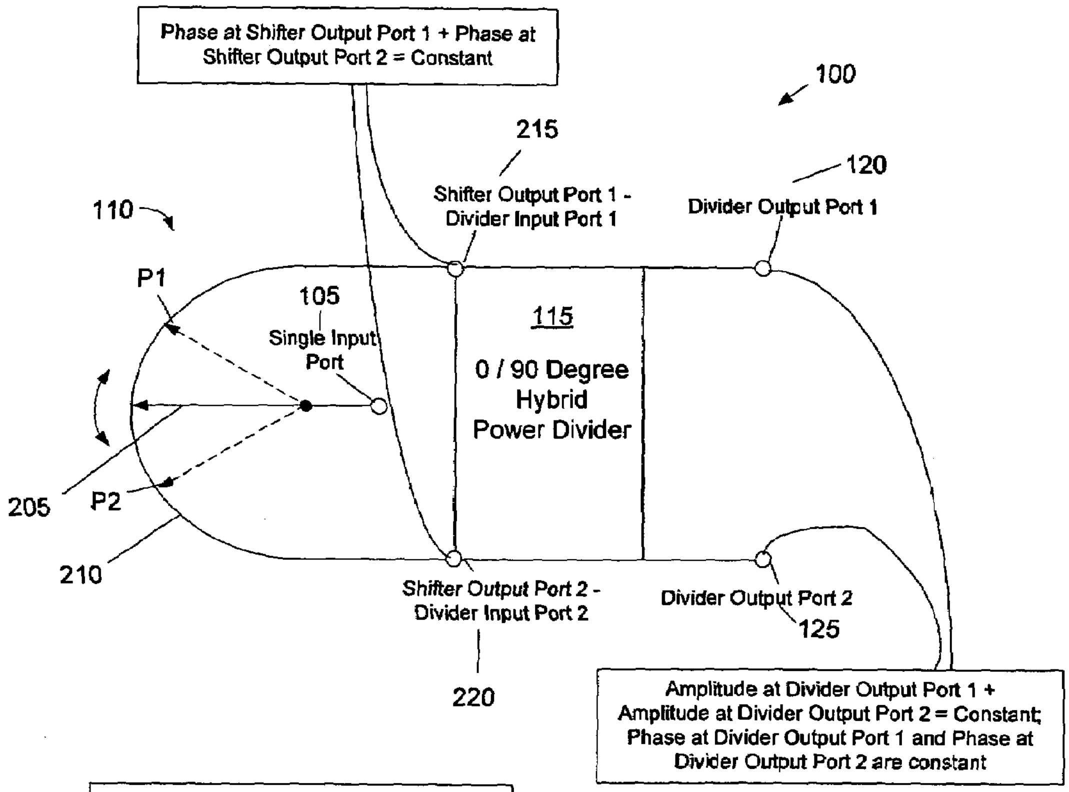
FIG. 6 is a functional block diagram illustrating further details of an exemplary variable phase shifter with an electrical path length control range of −45 degrees to +45 degrees of phase ($\Delta\phi=\pm 90$ degrees) of the variable power divider as well as phase shifts and amplitude adjustments according to one exemplary embodiment of the present invention.

Referring now to FIG. 6, this figure is a functional block diagram illustrating further details of an exemplary phase shifter 110 with an electrical path length control range of −45 to +45 degrees phase of a variable power divider 100 about a predefined reference position. This path length variation corresponds to $\Delta\phi=\pm 90$ degrees of relative phase variation for the two output signals of the phase shifter. This figure also illustrates exemplary phase shifts and amplitude adjustments according to one exemplary embodiment of the present invention. The phase shifter 110 can comprise a single input port 105 coupled to a first electrical path 205 that is moveable along a second electrical path 210 that is stationary relative to the first electrical path 205. The exemplary phase shifter 110 can be characterized as a three port device having an input port 105 and two output ports 215 and 220. The first electrical path 205 can also be referred to as a variable adjuster. In the preferred embodiment, the phase shifter 110 comprises a microstrip phase shifter.

When the first input port 105 is fed with an RF signal, the first electrical path 205 in combination with the second electrical path 210 produces two complementary phase shifted RF signals that can be measured at a first phase shifter output port 215 and a second phase shifter output port 220. In other words, the first electrical path or variable adjuster 205 can split an RF signal into two phase shifted RF signals that propagate along the second electrical path 210 in two different directions towards a first phase shifter output port 215 and a second phase shifter output port 220. The two RF signals produced after the split can have substantially equal amplitudes but with adjustably variable differential phases that can be a function of the variable adjuster 205.

One unique property of the exemplary phase shifter 110 is that the function of splitting an RF signal and the function of phase shifting the RF signals after the splitting function are performed integral to one another by a single component which can comprise the variable adjuster 205 and the second electrical path 210. Because of this integral signal splitting and phase shifting function, the phase shifter 110 can also be referred to as a single-control phase shifter 110.

Another unique property of the exemplary phase shifter 110 is that the variable adjuster 205 in combination with the second electrical path 210 divide the RF power received from the single input port 105 equally through out an adjustment range of the variable adjuster 205. In the exemplary embodiment illustrated, the variable adjuster 205 can have a defined adjustment or control range where a sum of the complementary phases of the RF signals produced after the split are constant throughout the adjustment range of the variable adjuster 205.

In other words, the phase shifted RF signals are complementary in that a sum of the phase of the RF signal at the first phase shifter output port 215 and the phase of the RF signal at the second phase shifter output port 220 is substantially equal to a constant quantity throughout the adjustment range of the variable adjuster 205. The phase of the RF signal at the first phase shifter output port 215 can be varied or made different relative to the phase of the RF signal at the second phase shifter output port 220 by moving the first electrical path 205 to a position along the second electrical path 210 such that one RF signal propagates along a first portion of the second electrical path 210 coupled to the first phase shifter output port 215 while another RF signal propagates along a second portion of the second electrical path 210 coupled to the second phase shifter output port 220 that can be longer or shorter relative to the first portion of the second electrical path 210.

For example, when the first electrical path 205 is placed at a centered position that bisects the second electrical path 210 into two portions of equal physical lengths, the two complementary RF signals produced are in-phase and have substantially equal power amplitudes. When the first electrical path 205 is placed a position P1 that corresponds to a signal path length away from and above the centered position and the signal path length is forty-five electrical degrees of phase at the nominal frequency of operation, the two complementary RF signals will have a phase difference of ninety degrees relative to one another at the nominal frequency of operation and with substantially equal power amplitudes. Specifically, the RF signal measured at second phase shifter output port 220 will have a phase that lags the RF signal measured at the first phase shifter output port 215 by ninety degrees.

When the first electrical path 205 is placed a position P2 that corresponds to a signal path length away from and below the centered position and the signal path length is forty-five electrical degrees of phase at the nominal frequency of operation, the two complementary RF signals will also have a phase difference of ninety degrees relative to one another and with substantially equal power amplitudes. Specifically, the RF signal measured at first phase shifter output port 215 will have a phase that lags the RF signal measured at the second phase shifter output port 220 by ninety degrees.

In the exemplary embodiment illustrated in FIG. 6, the variable adjuster 205 is rotatable relative to an arc-shaped second electrical path 210. However, the present invention is not limited to rotatable adjusters 205 and arc-shaped second electrical paths 210. Other types of adjusters and second electrical paths 210 are not beyond the scope of the present invention as will become apparent from the discussion of FIG. 10 described below.

The first and second phase shifter output ports 215 and 220 can also be referred to as the first and second power divider input ports 215 and 220 since a hybrid power divider 115 is coupled to the phase shifter 110 at these ports. The hybrid power divider 115 typically comprises a four port device, having input ports 215 and 220 and output ports 120 and 125. The hybrid power divider 115 usually comprises a structure having a dominant transverse electromagnetic (TEM) mode of propagation (e.g., stripline, coax, square-coax, rectangular-coax) or structure having a quasi-TEM type mode of propagation (e.g., microstrip, coplanar waveguide). These TEM or quasi-TEM structures are different from conventional waveguide structures that are usually characterized as having a longitudinal component of the electric and/or magnetic field of the propagating mode.

In one preferred and exemplary embodiment, the structures for the exemplary hybrid power divider 115 can comprise branch-line hybrids that are typically made of single layer substrates. Such an exemplary embodiment is easy to manufacture since the number of parts and amount of material in this embodiment is reduced. Reducing the parts and/or material of the hybrid power divider can also substantially reduce manufacturing costs relative to other types of hybrid power dividers 115. Alternatively, the structures for the hybrid power divider 115 can comprise couplers that typically have multiple planar layers, usually referred to as multilayered structures. Also the structures for the hybrid power divider 115 can comprise stripline versions, air versions of microstrip, air versions of stripline, square-coax or rectangular-coax, and other like structures.

In the exemplary embodiment illustrated in FIG. 6, the hybrid power divider 115 can comprise a zero degree/ninety degrees or quadrature hybrid power divider. However, as will be come apparent from the discussion of FIG. 7 below, the present invention is not limited to zero degree/ninety degrees or quadrature hybrid power dividers. The invention can comprise zero degree/one-hundred-eighty degrees hybrid power dividers as known to those of ordinary skill in the art.

The hybrid power divider 115 illustrated in FIG. 6 used in combination with the single-control phase shifter 110 outputs two RF signals that have a substantially constant and equal phases throughout the adjustment range of the variable adjuster 205 and having power amplitudes that are a function of variable phase shifted RF signals received at the input ports 215 and 220 of the hybrid power divider 115. In other words, the power amplitudes of the two RF signals measured at the output ports 120 and 125 of the hybrid power divider are a function of the position of the variable adjuster 205.

One unique property of hybrid power divider 115 used in combination with the single-control phase shifter 110 is that the RF signals measured at the output ports 120 and 125 are complementary relative to each other. In other words, a sum of the RF power of the RF signal measured at the first output port 120 and RF power of the RF signal measured at the second output port 125 is substantially equal to a constant quantity throughout the adjustment range of the variable adjuster 205.

To achieve this unique property of two output RF signals having substantially constant phases and complementary and variable power amplitudes, the hybrid power divider 115 is used in combination with the single-control phase shifter 110. The single-control phase shifter 110 receives an RF signal at the single input port 105 and produces two RF signals of substantially equal amplitude and relatively complementary phases at the phase shifter output ports 215 and 220. In other words, a sum of the phase value of the RF signal measured at the phase shifter output port 215 and the phase value of the RF signal measured at the phase shifter output port 220 is substantially equal to a constant quantity throughout the adjustment range of the variable adjuster 205. The hybrid power divider generates a phase difference between the RF signals received at its input ports 215 and 220 as is known to those of ordinary skill in the art. The hybrid power divider also divides and recombines the RF signals received at its input ports 215 and 220 as is also known to those of ordinary skill in the art.

For the zero degree/ninety degrees hybrid power divider illustrated in FIG. 6, the first hybrid power divider output port 120 is designated the reference phase (0 degree) port for an input signal, at the first hybrid power divider input port 215 and the second hybrid power divider output port 125 is designated the quadrature (ninety degrees) port for an input signal at the first hybrid power divider input port 215. Conversely, the second hybrid power divider output port 125 is designated the reference phase (0 degree) port for an input signal at the second hybrid power divider input port 220 and the first hybrid power divider output port 120 is designated the quadrature (ninety degrees) port for an input signal at the first hybrid power divider input port 215.

When the variable adjuster or arm 205 is at position P1 which is forty-five electrical degrees above the center position of the variable adjuster 205, substantially all of the available RF power is present at the second hybrid power divider output port 125 while substantially no RF power is present at the first hybrid power divider output port 120. This is because at position P1, a phase difference of ninety degrees exists between the two RF signals measured at phase shifter output ports 215 and 220. Specifically, the RF signal measured at the first phase shifter output port 215 leads the RF signal measured at the second phase shifter output port 220 by the ninety degrees.

Conversely, when the variable adjuster or arm 205 is at position P2 which is forty-five electrical degrees below the center position of the variable adjuster 205, all of the RF power is present at the first hybrid power divider output port 120 while no RF power is present at the second hybrid power divider output port 125. This is because a phase difference of ninety degrees exists between the two RF signals measured at phase shifter output ports 215 and 220. Specifically, the RF signal measured at the second phase shifter output port 220 leads the RF signal measured at the first phase shifter output port 215 by the ninety degrees.

When the variable adjuster or arm 205 is at the center position along the second electrical path 210, RF power is substantially divided equally between the first and second hybrid power divider output ports 120 and 125. Specifically, the RF signal measured at first phase shifter output port 215 and the second phase shifter output port 220 have substantially equal phase quantities.

Figure 7:
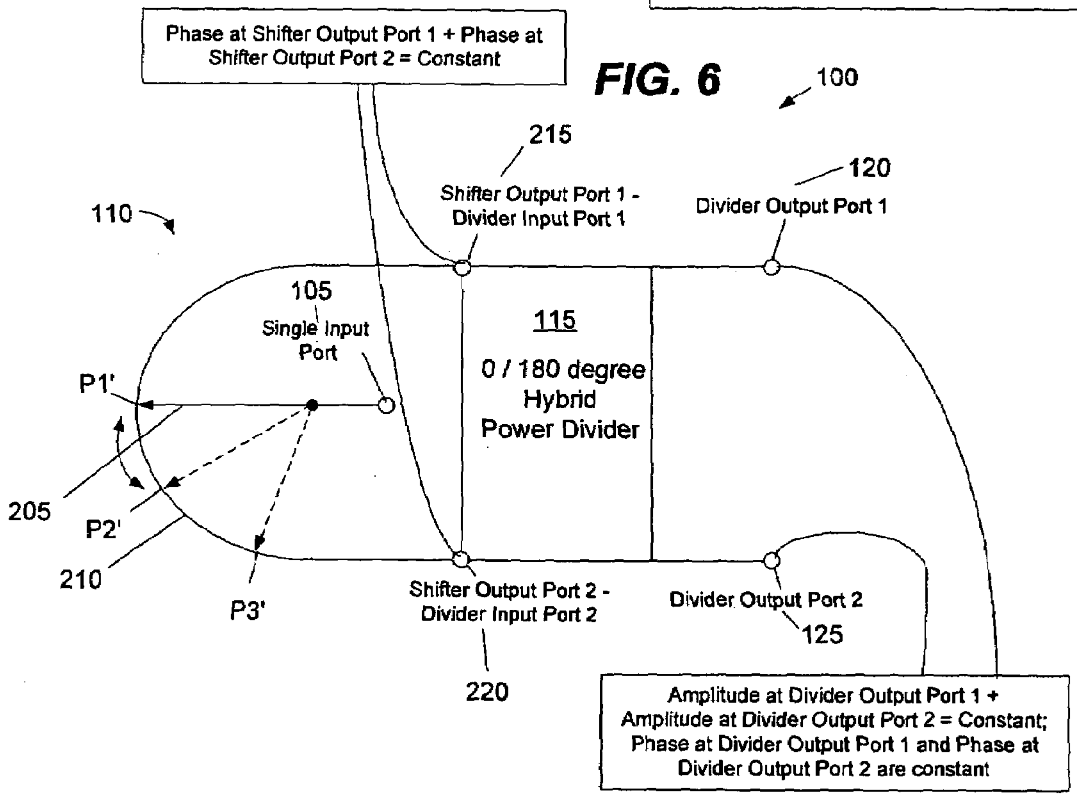
FIG. 7 is a functional diagram illustrating further details of an exemplary variable phase shifter with a path length control range of ninety degrees electrically for the variable power divider as well as phase shifts and amplitude adjustments according to one exemplary embodiment of the present invention.

Referring now to FIG. 7, this is a functional diagram illustrating further details of an exemplary phase shifter 110 with a control range of ninety electrical degrees for the variable power divider 115. This figure also illustrates exemplary phase shifts and amplitude adjustments according to another exemplary embodiment of the present invention. Since the variable power divider 100 of FIG. 7 has several components similar to the variable power divider 100 illustrated in FIG. 6, only the differences between FIG. 6 and FIG. 7 will be discussed below.

For the zero degree/one-hundred-eighty degrees hybrid power divider 115 of the variable power divider 100 illustrated in FIG. 7, the first hybrid power divider output port 120 is designated as the in-phase or sum (0 degree) port and the second hybrid power divider output port 125 is designated as the difference (one-hundred-eighty degrees) port. When the variable adjuster or arm 205 is at position P1' which is the center position for the variable adjuster 205, substantially all of the RF power is present at the first hybrid power divider output port 120 while substantially no RF power is present at the second hybrid power divider output port 125.

Conversely, when the variable adjuster or arm 205 is at position P3' which is ninety electrical degrees below the center position of the variable adjuster 205, all of the RF power is present at the second hybrid power divider output port 125 while no RF power is present at the first hybrid power divider output port 120. This is because when the variable adjuster or arm 205 is moved ninety electrical degrees along the second electrical path 210, a phase difference of one-hundred-eighty degrees exists between the two RF signals measured at phase shifter output ports 215 and 220. Specifically, the RF signal measured at the second phase shifter output port 220 leads the RF signal measured at the first phase shifter output port 215 by the one-hundred-eighty degrees.

When the variable adjuster or arm 205 is at position P2' which is forty-five electrical degrees below the center position of the variable adjuster 205, RF power is divided equally between the first and second hybrid power divider output ports 120 and 125. This is because when the variable adjuster or arm 205 is moved forty-five electrical degrees along the second electrical path 210, a phase difference of ninety degrees exists between the two RF signals measured at phase shifter output ports 215 and 220. Specifically, the RF signal measured at the second phase shifter output port 220 leads the RF signal measured at the first phase shifter output port 215 by the ninety degrees.

The present invention is not limited to the positions P1', P2', and P3' illustrated in the drawings. Since the phase shifter 110 illustrated in FIG. 7 is symmetrical, positions P2' and P3' could be above the center or zero degree position P1' and yield similar results. Other positions of the phase variable adjuster 205 of the phase shifter 110 are not beyond the scope the present invention.

Referring now to FIGS. 8A and 8B, these figures are illustrations showing a variable adjuster 205 for two output ports of an exemplary microstrip phase shifter 110 according to one exemplary embodiment of the present invention. FIG. 8B is referred to at this point since it illustrates a close-up bottom view of the variable adjuster 205 illustrated in FIG. 8A. Since the variable power divider 100 of FIGS. 8A and 8B has several components similar to the variable power divider 100 illustrated in FIG. 6, only the differences between FIG. 6 and FIGS. 8A and 8B will be discussed below.

As noted above, the present invention is not limited to the specific mechanical structures of the phase shifter 110 illustrated in FIGS. 8A and 8B. FIGS. 8A and 8B provide one preferred but an exemplary embodiment of the mechanical structure for a phase shifter 110 that is part of the present invention. Other phase shifter structures can include, but are not limited to, capacitively coupled sliding sleeves (as discussed below with reference to FIG. 10), moving dielectrics in tandem, waveguides, and other similar structures that have three ports (an input port and two output ports) and can impart phase shifts between RF signals such that a sum of the phase shifts of between the RF signals substantially equals a constant throughout the adjustment range of the variable adjuster 205. In other words, the present invention can employ numerous types of phase shifting structures providing the signal characteristics above without departing from the scope and spirit of the present invention.

Referring to FIG. 8A, the phase shifter 110 illustrated in this figure comprises a nut 400, a washer 405, a spring 410, a key 415, a variable adjuster 205, a dielectric spacer 430, and a shaft 425. Further details of the nut 400, the washer 405, the spring 410, the key 415, the dielectric spacer 430, and the shaft 425 will be discussed below with respect to FIG. 9.

Referring now to FIGS. 8A and 8B, the variable adjuster 205 is rotatably fastened to a planar surface 335. The variable adjuster 205 can comprise a coupling ring 310, a wiper element 300, a mid-portion 305, a support trace 320A, and a dielectric support 340. The variable adjuster 205 comprising the coupling ring 310, wiper element 300, and mid-portion 305 can have an electrical length L1 that is preferably (lamda)/4, where lambda is, very approximately, the wavelength of the propagating signal in the circuit.

The electrical length L1 of approximately a quarter wavelength of the propagating signal in the circuit can be measured from a geometric center of the aperture 315 to a mid-point of the wiper element 300 as illustrated in FIG. 8. It is noted that the electrical length is approximately equal to this distance L1 of the variable adjuster 205. And the actual physical size of variable adjuster 205 is usually found experimentally for most applications.

This means that the variable adjuster 205 can have other electrical lengths without departing from the scope and spirit of the present invention. That is, the electrical length L1 can be increased or decreased in size without departing from the present invention. As another example of adjusting the electrical length, L1 can have an electrical length of one-half of a wavelength at the operating radio frequency. Alternatively, the variable adjuster 205 could have a length L1 that is a multiple of one-quarter of a wavelength or one-half of a wavelength at the operating radio frequency.

Further, the electrical length L1 could comprise magnitudes larger than one-half wavelength but it is noted that the operating bandwidth could be reduced with such electrical lengths that are greater than one-half of a wavelength of the operating radio frequency. Also, the exemplary quarter wavelength dimension can be adjusted (increased or decreased) if the size of the feed lines are adjusted or if the dielectric materials used within the phase shifter 110 are changed or both.

The wiper element 300 can comprise an arc shaped member. However, other shapes are not beyond the scope of the present invention. The shape of the wiper element 300 is typically a function of the shape of a feed line 210 that is capacitively coupled with the wiper element 300 as will be discussed below.

The variable adjuster 205 in one exemplary embodiment has a dielectric support 340 that can comprise a rigid material such as a printed circuit board (PCB), plastic, or a ceramic material. A preferred exemplary substrate material for the dielectric support 340 is material identified as model RO-4003, available from Rogers Microwave Products in Chandler, Ariz. The variable adjuster 205 and dielectric support 340 has been made using PTFE substrate materials and one such material is model DiClad-880 available from Arlon Materials For Electronics in Bear, Del.

The coupling ring 310, wiper element 300, mid-portion 305, and support traces 320A disposed on the variable adjuster 205 can comprise copper material. This copper material can comprise etched microstrip transmission lines. This copper material can also be coated with tin as applied through a plating process to provide a protective layer for the copper against oxidation or corrosion, or both. Alternatively, support traces 320A can be constructed from dielectric materials. However, when the support traces 320A are constructed with the same material as the coupling ring 310, wiper element 300, mid-portion 305, such a design lends itself to efficient and cost effective etching manufacturing processes.

The variable adjuster 205 further comprises an aperture 315, wing portions 345, and an arm portion 350. The wing portions 345 are designed to correspond with the first set of support traces 320A and give added support for maintaining a level position of the variable adjuster 205 relative to the planar surface 335 throughout the variable adjuster's range of rotation. Specifically, the wing portions 345 are shaped to correspond with a shape of the support traces 320A in order to minimize the amount of the surface area of the variable adjuster 205 in order to conserve materials and also to reduce any affects the materials may have on RF propagation.

The coupling ring 310, wiper element 300, and midportion 305 are preferably constructed as relatively flat or planar elements that remain flat or substantially planar throughout the full range of movement across the distribution network 355. The shape of the variable adjuster 205 comprising the arm portion 350 and wing portions 345 facilitate the balance loading of the variable adjuster 205 to permit smooth rotation while maintaining this relatively flat design through full ranges of the variable adjuster's circular rotation.

The overall shape of the variable adjuster 205 is typically a function of the number of feed lines that will be interacting with the variable adjuster 205 and is shaped to keep a balanced load across the variable adjuster 205 as the coupling ring 310, wiper element 300, and mid portion 305 are capacitively coupled with corresponding structures on the planar surface 335. The shape of the variable adjuster 205 is further dependent upon a design to reduce the amount of dielectric or metallic material that is adjacent to the traces on the planar surface 335 throughout the circular movement of the variable adjuster.

The planar surface 335 may support various segments of the feed lines 355 that interact with the wiper element 300. The planar surface 335 comprises a coupling ring 325 that is part of a first feed line 355A. The coupling ring 325 of the first feed line 355A comprising the input port 105 is also spaced from an aperture 360. The geometry of the coupling ring 325 that forms part of the first feed line 355A generally corresponds with the geometry of the coupling ring 310 of the variable adjuster 205. This similar geometry yields a proper impedance match to optimize an input signal's RF power to be propagated through the variable adjuster 205 as the variable adjuster 205 is rotated. This similar geometry also provides increased contact area and reliability between the respective coupling rings 310, 325 on the variable adjuster 205 and planar surface 335.

The planar surface 335 further comprises a second feed line 355B that also includes a shaped portion 210 that corresponds with the shape of the wiper element 300 of the variable adjuster 205. The first and second feed lines 355A, 355B, as well as a second set of support traces 320B disposed on the planar surface 335 can comprise microstrip transmission lines that are etched from a printed circuit board material. Specifically, the first and second feed lines 355A, 355B, as well as the support traces 320B disposed on the planar surface 335 can comprise copper materials coated with tin. However, the support traces 320B can comprise dielectric materials instead of conductive materials.

The first and second pairs of support traces 320A, 320B disposed on the variable adjuster 205 and on the planar surface 335 help facilitate the smooth rotation of the phase shifter 110 by providing opposing forces relative to the forces generated as the wiper element 300 of the variable adjuster 205 moves over the second feed line 355B. By facilitating this smooth rotation, the support traces 320A, 320B can provide a condition so that there are even forces on the traces 320A, 320B to minimize wear to provide a consistent desired spacing at the two capacitive junctions discussed above. The reduction of wear is important when the feed lines 355 and variable adjuster 205 have a very small thickness.

Specifically, the conductive feed lines 355 have a small thickness or height above the planar surface that supports them. The height of these microstrip lines 355 typically is that associated with one-half or one ounce copper, a term known to those familiar with the art. Thinner or thicker microstrip lines (smaller or larger degrees of microstrip's height about the planar surface it is manufactured on) can be used in the described phase shifter 110. The support traces 320A, 320B can be sized in length, width, and thickness such that they do not interfere with the electrical characteristics of the feed lines when RF energy is being propagated.

The location of the support traces 320B positioned on the planar surface 355 correspond with the location of the matching support traces 320A disposed on the wings 345 of the variable adjuster 205. The thickness of the support traces 320A on the wings 345 and the thickness of the support traces 320B on the planar surface 355 compensate for the thickness of the remaining traces that are aligned between the variable adjuster 205 and the feed lines 355. Basically, the support traces 320 keep the variable adjuster 205 level and parallel to the face of the planar surface 335 during rotation, and reduce wear on the capacitively-coupled rings 310, 325 and other traces. The semi-circular design of the support traces 320 allow the variable adjuster to be held in position on the face of the planar surface 335 in a very stable fashion throughout the circular movement of the variable adjuster 205.

The wiper element 300 is capacitively coupled to the shaped feed line portion 210 of the second feed line 355B in order to achieve low passive intermodulation (PM) effects. Capacitive junctions and non-metallic materials for selected components of the phase shifter 110 are used to prevent, where possible, direct physical contact between conductive metal surfaces in order to further minimize the generation of PIM in a high power, multi-carrier RF environments.

Capacitive junctions 330A, 330B indicated by dashed lines are formed by the following structures: (1) the combination of the wiper element 300, the dielectric spacer 430, and the shaped feed line portion 210 of the second feed line 355B; and (2) the combination of the conductive ring 310 of the variable adjuster 205, the dielectric spacer 430, and the coupling ring 325 that is part of the first feed line 355A. These capacitive junctions can facilitate the transfer of an input RF signal from the phase shifter 110 to the phase shifter outputs 215, 220.

An input section of the phase shifter 110 can be represented by a first capacitive junction 330B formed by the coupling rings 310, 325. An output section of the phase shifter 110 can be represented by second capacitive junction 330A formed by the combination of the wiper element 300 and the shaped feed line portion 210 of the second feed line 355B.

The phase shifter 110 can comprise a relatively compact structure in order to evenly distribute the compressive load on the variable adjuster 205, which in turn, maintains the predetermined value of capacitance between the rings 310, 325 and between the wiper element 300 and shaped portion 210 of the second feed line 355B.

While the phase shifter 110 of the exemplary variable power divider 100 can comprise a relatively compact structure, the structure can be sized or dimensioned to achieve a full range of movement necessary to produce various levels of desired electrical phase shifts. Further details of the microstrip phase shifter 110 are mentioned in co-pending, commonly assigned, application Ser. No. 10/226,641, entitled, "Microstrip Phase Shifter," filed on Aug. 23, 2002, the entire contents of which are hereby incorporated by reference.

Referring now to FIG. 9, this figure is an illustration showing an isometric view of an assembled phase shifter 110 according to an exemplary embodiment of the present invention. Since the variable power divider 100 of FIG. 9 has several components similar to the variable power divider 100 illustrated in FIG. 6, only the differences between FIG. 6 and FIG. 9 will be discussed below.

As mentioned above, the phase shifter 110 can further comprise a key 415, a spring 410, and a washer 405. These elements are held together by a support architecture 420 that can comprise a shaft 425 and a nut 400. Either the shaft 425 or the nut 400 may be made from a conductive material, while the other is nonconductive, or both can be made from nonconductive materials. The washer 405 and key 415 are preferably constructed from non-metallic materials according to one exemplary embodiment of the present invention.

The spring 410 can be implemented as a thin and wide, cylindrical structure that applies force over a large area of the variable adjuster 205. In one exemplary embodiment, the key 415 comprises a plastic disk. However, other dielectric materials are not beyond the scope and spirit of the present invention.

Those skilled in the art will also appreciate that the selection of non-conductive materials for various components of the phase shifter 110 can be important in order to prevent PIM problems. The selection of non-conductive materials for the various components of the phase shifter 110 is also important to maintain good dielectric properties for RF signal propagation.

Movement of the variable adjuster is effectuated by the shaft 425 interacting with the key 415. The shaft is typically assembled by inserting it through an aperture 360 disposed in the planar surface 335 (illustrated in FIG. 8A). The phase shifter 110 is positioned proximate to the aperture 360 disposed in the planar surface 335 to allow the shaft 425 to pass through the planar surface 335 and to interact with the key 415 to effectuate movement of the variable adjuster 205. The combination of the support architecture 420, washer, spring 410, key 415, the dielectric spacer 430 (shown in FIG. 8A), and variable adjuster 205, applies downward pressure on the variable adjuster 205 while allowing the shaft to rotate the variable adjuster 205 through a relatively full range of circular motion.

The phase shifter 110 is coupled to an exemplary branchline quadrature hybrid power divider 115. This branchline quadrature hybrid power divider 115 is constructed in microstrip and is a preferred, yet exemplary embodiment. Those skilled in the art that other hybrid power dividers 115 can be used without departing from the scope and spirit of the present invention.

Figure 10:
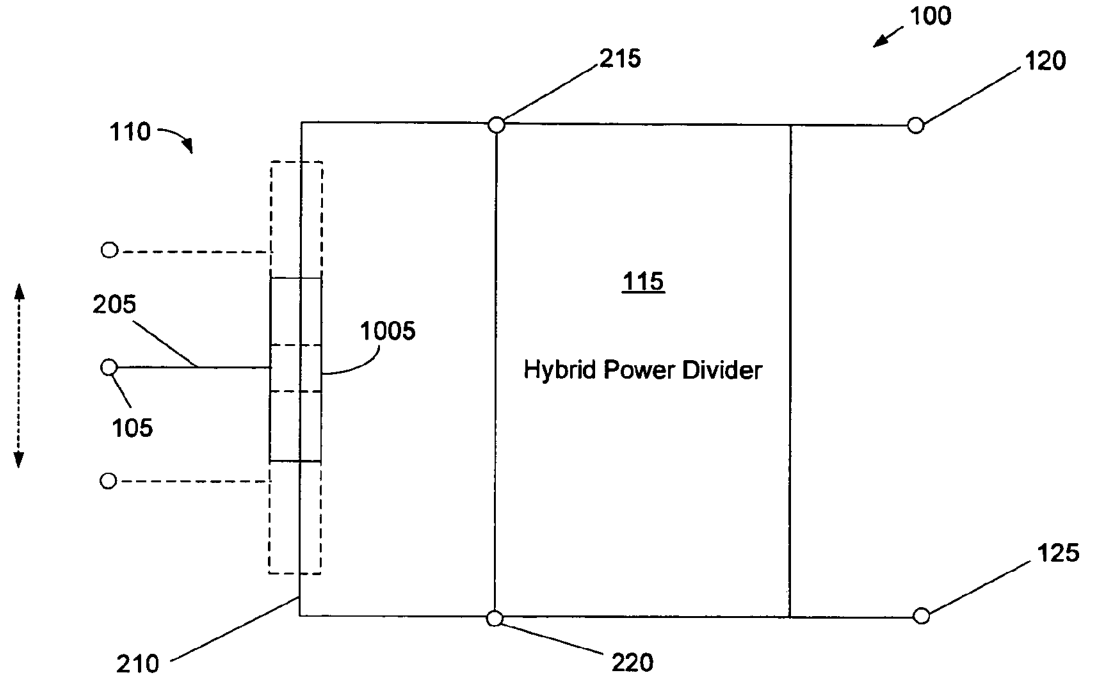
FIG. 10 is a functional block diagram illustrating further details of another exemplary variable phase shifter of the variable power divider according to an alternative embodiment of the present invention.

Referring now to FIG. 10, this figure is a functional block diagram illustrating further details of another exemplary phase shifter 110 for a variable power divider 100 according to an alternative embodiment of the present invention. FIG. 10 demonstrates how the present invention is not limited to the specific mechanical structures mentioned in this detailed description. Those skilled in the art will appreciate that other phase shifter structures (not shown) can include, but are not limited to, moving dielectrics in tandem, waveguides, and other similar structures that have three ports (an input port and two output ports) and can impart phase shifts between RF signals such that a sum of the phase shifts of between the RF signals substantially equals a constant throughout the adjustment range of the variable adjuster 205.

Since the variable power divider 100 of FIG. 10 has several components similar to the variable power divider 100 illustrated in FIG. 6, only the differences between FIG. 6 and FIG. 10 will be discussed below. The phase shifter 110 of this exemplary embodiment comprises a single input port 105. The phase shifter 110 can be adjusted mechanically by sliding the variable adjuster 205 along an electrical length 210 so as to alter the relative phase of the signals at the phase shifter's outputs.

The variable adjuster 205 can comprise an external sleeve 1005 and an internal sleeve (not shown). These sleeves can be capacitively coupled to respective structures that form part of the second electrical length 210. For example, the external sleeve 1005 can be capacitively coupled to an outer conductive tube (not shown) in which the external sleeve 1005 slides along. Further, the internal sleeve (not shown) can be capacitively coupled to an inner rod (not shown) that is coaxial and disposed within the conductive tube (not shown).

The hybrid power divider 115 in this figure can comprise either a zero degree/ninety or a zero degree/one-hundred-eighty degrees hybrid power divider 115. While the phase shifter 110 illustrated in FIG. 10 is not a preferred exemplary embodiment, this phase shifter 110 demonstrates that the present invention is not limited to the mechanical embodiments described in this detailed specification. In other words, other mechanical structures for the phase shifters 110 of the present invention are not beyond the scope of the present invention as long as such phase shifters 110 comprise three port devices that divide RF power equally where the sum of the phases of the RF signals generated by the phase shifter 110 is substantially equal to a constant throughout the adjustment range of the variable adjuster 205.

Figure 11:
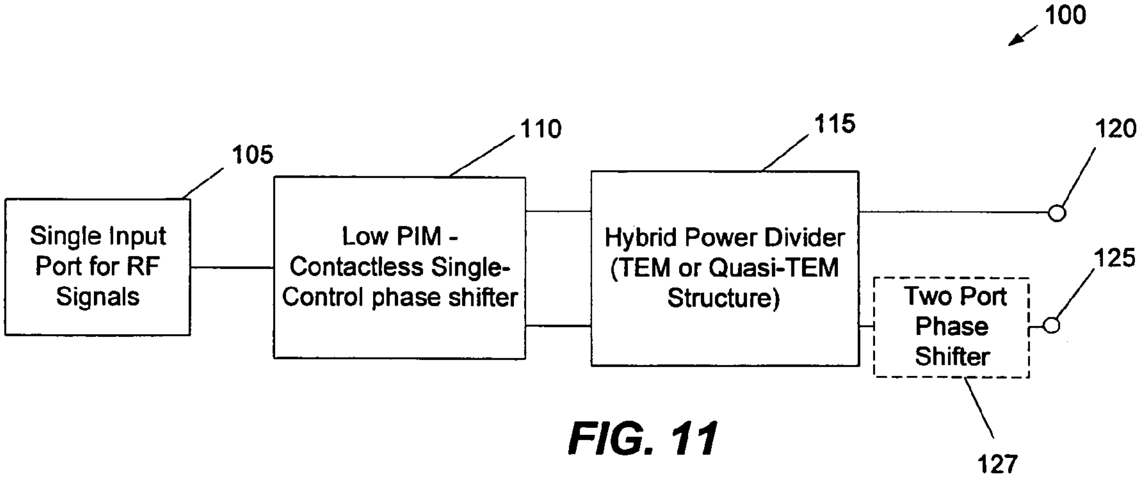
FIG. 11 is a functional block diagram illustrating hybrid power divider comprising TEM or quasi-TEM structures according to one exemplary embodiment of the present invention.

Referring now to FIG. 11, this figure is a functional block diagram illustrating hybrid power divider 115 comprising TEM or quasi-TEM structures according to one exemplary embodiment of the present invention. FIG. 11 illustrates some core components of a variable power divider 100 according to an exemplary embodiment of the present invention. The variable power divider 100 of this figure can comprise a single input port 105 for RF signals. The variable power divider 100 can further comprise a low PIM single-control phase shifter 110 and a power divider 115 that may include a TEM or quasi-TEM structure.

The variable power divider 100 can further comprise output ports 120, 125. Coupled to one of the output ports, such as the second output port 125, can be an optional two port phase shifter 127. The optional two port phase shifter 127 can be used to adjust the relative phase between the RF signals measured at the output ports 120, 125 such as in the case when a zero degree/one-hundred-eighty degrees power divider instead of a zero degree/ninety degrees power divider is employed for the hybrid power divider 115. In such a scenario, the two port phase shifter could compensate for any phase difference that exists between the RF signals measured at the first and second output ports 120, 125 of the hybrid power divider 115. Those skilled in the art recognize that the optional two port phase shifter 127 can be coupled to either output port of the hybrid power divider 115.

Like an antenna, the variable power divider 100 described herein is a passive reciprocal device. Its performance characteristics are independent of the primary direction of RF energy flow. The variable power divider 100 is, therefore, equally effective for use in both transmitting and receiving RF signals.

Figure 12:
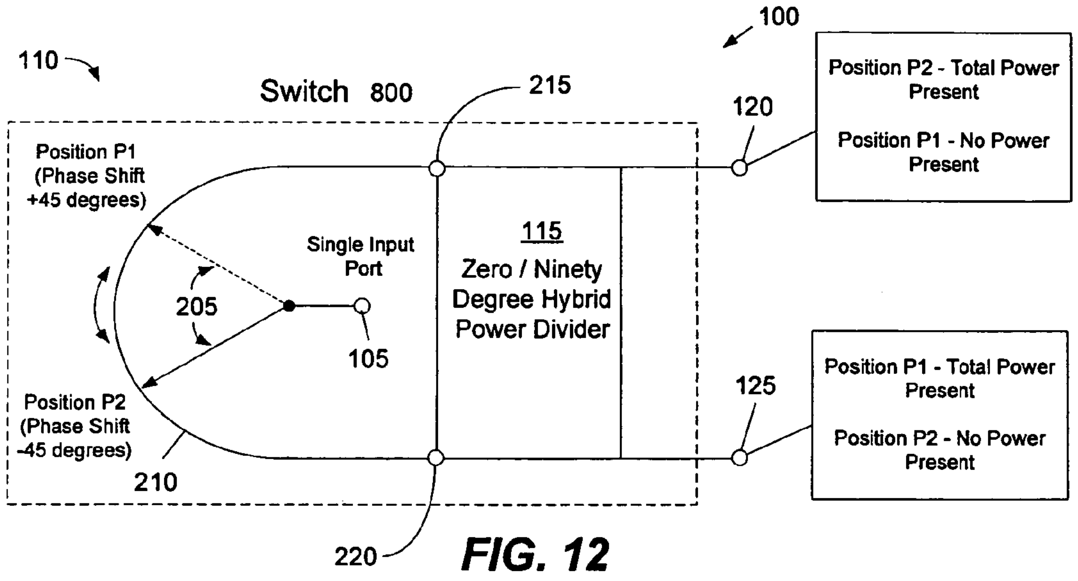
FIG. 12 is a functional block diagram illustrating how the variable power divider functions as a switch according to one exemplary embodiment of the present invention.

Referring now to FIG. 12, this is a functional block diagram illustrating how a variable power divider 100 can function as an RF switch 800 according to one exemplary embodiment of the present invention. The hybrid power divider 115 in this exemplary embodiment can comprise a zero degree/ninety degrees hybrid power divider 115. With this type of power divider 115, there are two unique positions of the phase shifter 110 that generate phases that provide two end points of the operating range for the power divider 115.

The first hybrid power divider output port 120 is designated the reference phase (0 degree) port for an input signal at the first hybrid power divider input port 215 and the second hybrid power divider output port 125 is designated the quadrature (ninety degrees) port for an input signal at the first hybrid power divider input port 215. Conversely, the second hybrid power divider output port 125 is designated the reference phase (0 degree) port for an input signal at the second hybrid power divider input port 220 and the first hybrid power divider output port 120 is designated the quadrature (ninety degrees) port for an input signal at the first hybrid power divider input port 215.

Specifically, when the variable adjuster or arm 205 is at position P1 that is forty-five electrical degrees above a center position for the variable adjuster 205, substantially all of the RF power is present at the second hybrid power divider output port 125 while substantially no RF power is present at the first hybrid power divider output port 120. This is because a phase difference of ninety degrees exists between the two RF signals measured at phase shifter output ports 215 and 220. Specifically, the RF signal measured at the first phase shifter output port 215 leads the RF signal measured at the second phase shifter output port 220 by the ninety degrees.

Conversely, when the variable adjuster or arm 205 is at position P2 that is forty-five electrical degrees below a center position for the variable adjuster 205, substantially all of the RF power is present at the first hybrid power divider output port 120 while substantially no RF power is present at the second hybrid power divider output port 125. This is because a phase difference of ninety degrees exists between the two RF signals measured at phase shifter output ports. 215 and 220. Specifically, the RF signal measured at the second phase shifter output port 220 leads the RF signal measured at the first phase shifter output port 215 by the ninety degrees.

The use of the variable power divider 100 as an electrical switch provides for both a matched and balanced load at all times during the adjustment range of the phase shifter 110. In other words, the phase shifter 110 of FIG. 12 provides matched impedance where RF energy always has an electrical path during the range of movement of the phase shifter 110. Unlike conventional switches which may break or short an electrical length for one output port of two output port device, the present invention always provides an electrical path for energy destined for both output ports 120 and 125.

The present invention when used as an RF switch is not limited to the exemplary embodiment illustrated in FIG. 12. For example, the hybrid power divider 115 could comprise a zero degree/one-hundred-eighty degrees power divider instead of a zero degree/ninety degrees power divider. For the zero degree/one-hundred-eighty degrees power divider, the end positions for a range of phase shifter 110 movement could include a center position and a position of ninety electrical degrees above or below the center position. With the adjuster 205 of the phase shifter 110 at a position of ninety electrical degrees above or below the center position, the RF signals measured at the output ports 215, 220 would have a phase difference of one-hundred-eighty degrees relative to each other.

Figure 13:
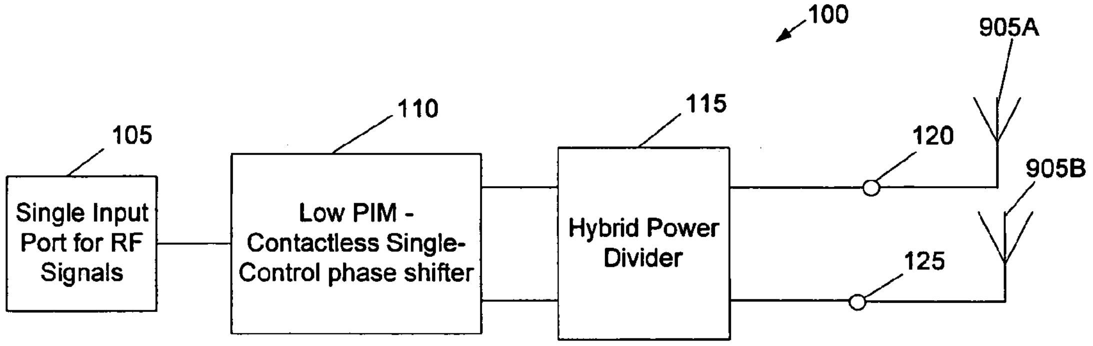
FIG. 13 is a functional block diagram illustrating the variable power divider coupled to antenna elements according to one alternative exemplary embodiment of the present invention.

Referring now to FIG. 13, this figure is a functional block diagram illustrating a variable power divider 100 coupled to antenna elements 905A, 905B according to one alternative exemplary embodiment of the present invention. This combination of elements forms a variable beam width antenna that can vary RF power between antenna elements 905A, 905B in order to change the beam width in the azimuth or horizontal plane. Each antenna element 905A, 905B of the exemplary embodiment illustrated in FIG. 13 can comprise an array of antenna elements arranged in a column.

Also, it is not beyond the scope of the present invention to attach additional multiple antenna elements to the output ports 120, 125. In other words, the output ports 120, 125 could be coupled to three columns of antenna elements 905A, 905B. For example, a first column can be coupled to the first output port 120 of a variable power divider 100 while two columns could be coupled to the second output port 125 of the variable power divider 100. Additional configurations of antenna elements 905A, 905B are not beyond the scope of the invention.

Figure 14:
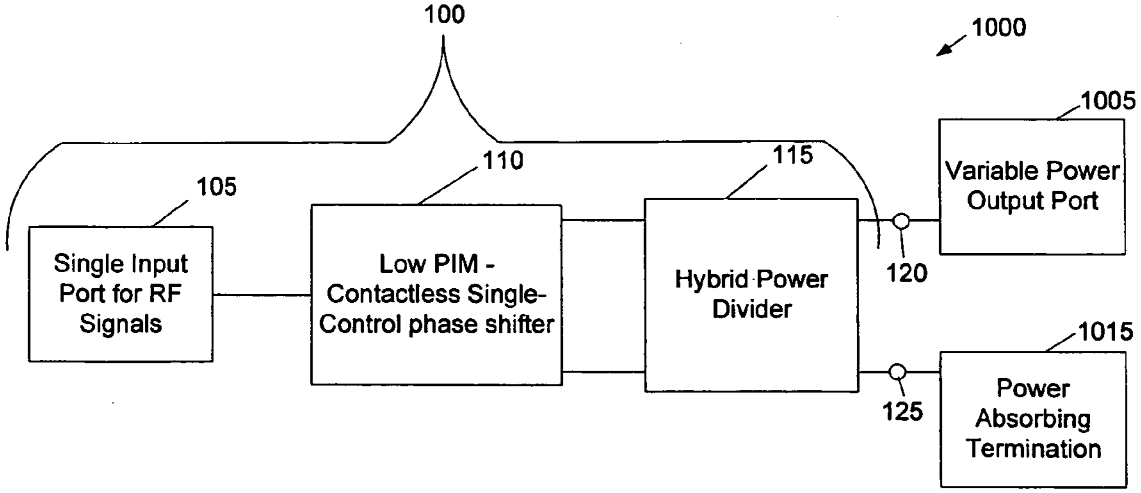
FIG. 14 is a functional block diagram illustrating how the variable power divider can function as a variable power attenuator when one output port is coupled to a power absorbing termination according to one alternative exemplary embodiment of the present invention.

Referring now to FIG. 14, this figure is a functional block diagram illustrating how the variable power divider 100 can function as a variable power attenuator 1000 when one output port 125 is coupled to a power absorbing termination 1015 according to one alternative exemplary embodiment of the present invention. In this exemplary embodiment, RF power is not conserved because of the power absorbing termination 1015. This means that the RF power of the second variable power divider output port 125 is dissipated as heat energy and the RF power at the output port 120 of the variable power attenuator 1000 is complementary to the RF power dissipated by the power absorbing termination 1015. In other words, a sum of the RF power at the first variable power divider output 120 and the RF power dissipated by the power absorbing termination 1015 is substantially a constant quantity.

The power absorbing termination 1015 can comprise a resistive load such as a resistor where RF power is converted into heat. Other power absorbing terminations 1015 are not beyond the scope of the present invention. With the variable power attenuator 1000, the power at the variable power output port 1005 can be increased or decreased.

Figure 15:
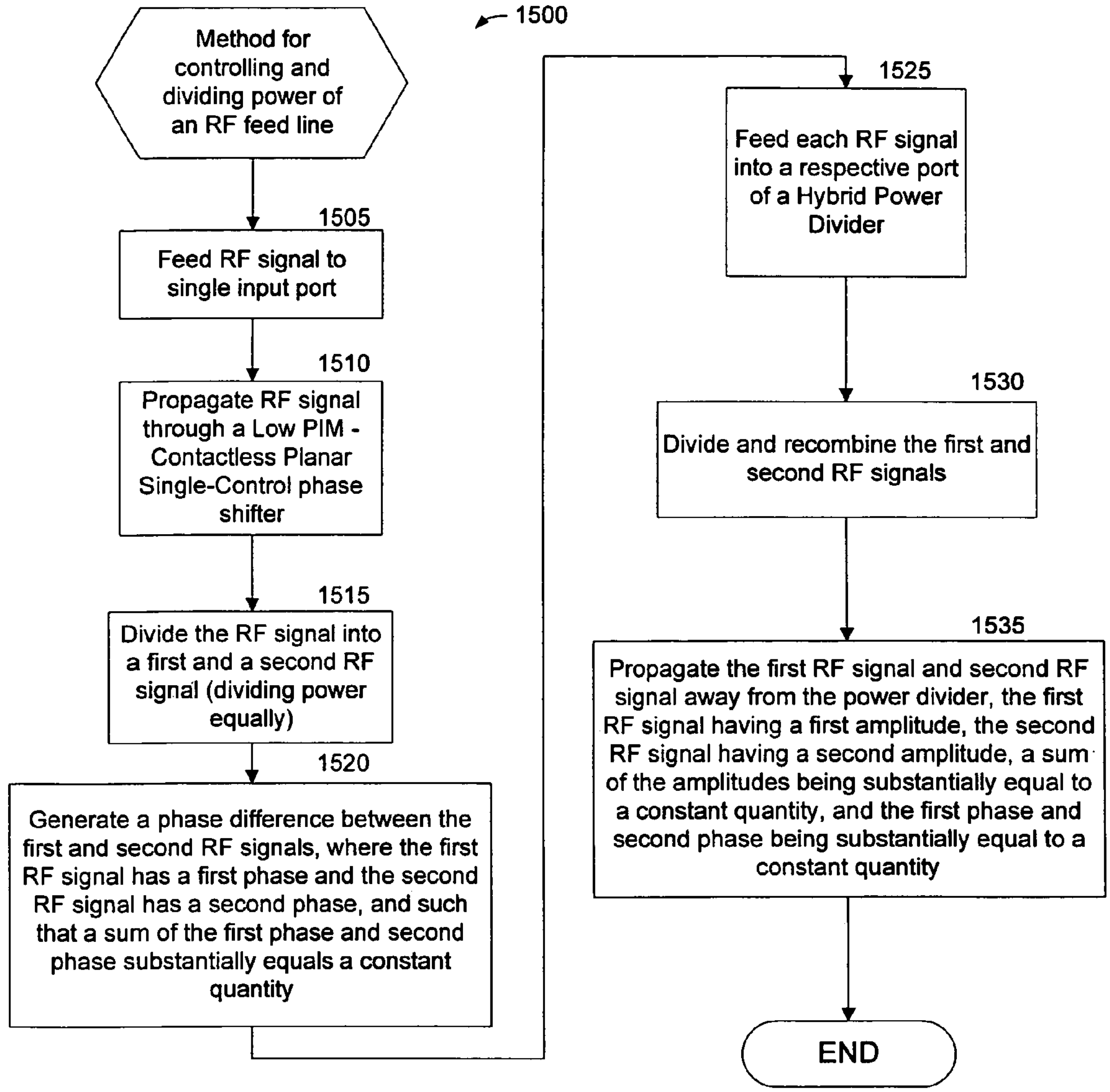
FIG. 15 is a logical flow diagram illustrating an exemplary method for controlling and dividing power of an RF signal according to one exemplary embodiment of the present invention.

Referring now to FIG. 15, this figure is a logical flow diagram 1500 illustrating an exemplary method for controlling and dividing power of an RF signal according to one exemplary embodiment of the present invention. Basically, the logic flow diagram 1500 highlights some key functions of the variable power divider 100 described above.

Certain steps in the process described below must naturally precede others for the present invention to function as described. However, the present invention is not limited to the order of the steps described if such order or sequence does not alter the functionality of the present invention. That is, it is recognized that some steps may be performed before or after other steps without departing from the scope and spirit of the present invention.

Further, as noted above, the variable power divider 100 described herein is a passive reciprocal device. The variable power divider 100 performance characteristics are independent of the primary direction of RF energy flow. The variable power divider 100 is, therefore, equally effective for use in both transmitting and receiving RF signals. The process below is described for a transmit case where the RF energy is fed into the single input port 105. Those skilled in the art will appreciate that steps mentioned below would be reversed if RF energy was fed at ports 120, 125 of the variable power divider 100.

Step 1505 is the first step in the exemplary method 1500 controlling and dividing power of an RF feed line. In step 1505, an RF signal is fed into a single input port 105 of a three port phase shifter 110 that is part of a variable power divider 100.

In Step 1510, the RF signal is propagated through the phase shifter 110. Specifically, the RF signal can be capacitively coupled into a first electrical length 205. The RF signal can travel along a first electrical length 205 that is moveable relative to a second electrical length 210. Next, in step 1515, the RF signal can be capacitively coupled from the first moveable electrical length 205 to a second stationary electrical length 210 where the RF signal is divided into two RF signals. In other words, the RF power in this step is divided equally among the two RF signals.

In Step 1520, a phase difference is generated by the phase shifter. Specifically, a phase difference can be generated between the two RF signals by propagating the RF signals along two portions of unequal lengths of the second electrical length 210. Due to the balanced division of the RF signal introduced at the single input port 105 and the generation of the phase difference with electrical paths of unequal lengths, the sum of a first phase of the first RF signal and a second phase of the second RF signal is substantially equal to a constant quantity throughout the adjustment range of the variable adjuster 205 as measured at the phase shifter output ports 215, 220.

In Step 1525, each RF signal is fed into a respective input port 215, 220 of a four port hybrid power divider 115. In step 1530, the first and second RF signals generated by the three port phase shifter 110 are divided and recombined by the four port hybrid power divider 115 as is known to those skilled in the art. While the first and second RF signals are divided and recombined within the hybrid power divider 115, a second phase difference is generated between the two RF signals. Next in Step 1535, the first and second RF signals are propagated away from the hybrid power divider 115 through the output ports 120, 125 where the first RF signal has a first power amplitude and second RF signal has a second power amplitude. A sum of the first and second output power amplitudes is substantially equal to a constant quantity throughout the adjustment range of the variable adjuster 205 while the phase of each RF signal is also substantially equal to a constant quantity throughout the adjustment range of the variable adjuster 205.

According to one exemplary embodiment, a phase of the first RF signal measured at the first hybrid power divider output port 120 is substantially equal to a phase of the second RF signal measured at the second hybrid power divider output port 125. According to another exemplary embodiment, a phase of the first RF signal measured at the first hybrid power divider output port 120 is offset by a substantially constant amount relative to a phase of the second RF signal measured at the second hybrid power divider output port 125 throughout the adjustment range of the variable adjuster 205.

Figure 16:
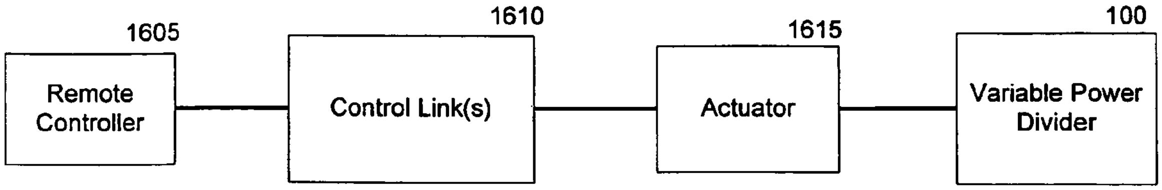
FIG. 16 is a functional block diagram illustrating remote control of a variable power divider according to one exemplary embodiment of the present invention.

Referring now to FIG. 16, this figure is a functional block diagram illustrating remote control of a variable power divider 100 according to one exemplary embodiment of the present invention. In this exemplary embodiment, the phase shifter 110 (not shown in FIG. 16 but illustrated in FIG. 6) of the variable power divider 100 can be coupled to an actuator 1615. The actuator can comprise an electromechanical device that imparts movement of the adjuster 205 (not shown in FIG. 16 but illustrated in FIG. 6) of the phase shifter 110 (not shown in FIG. 16 but illustrated in FIG. 6). The electromechanical device could include an electrical motor such as a stepper motor. However, the actuator 1615 of the present invention is not limited to the devices described herein. Other types of actuators 1615 are not beyond the scope and spirit of the present invention.

The actuator 1615 in one exemplary and preferred embodiment is coupled to a single phase shifter 110 and more specifically, a single adjuster arm 205 of a phase shifter 110. The actuator 1615 can be operated by a remote controller 1605 via a control link 1610. The control link 1610 can comprise at least one of a wired and wireless link. For example, the control link 1610 could comprise a conductive cable. Alternatively, the control link 1610 could comprise a wireless communications medium such as an RF link, an infrared link, or other similar wireless communications medium that does not interfere with the operation of the variable power divider 100 and any output devices coupled to the variable power divider 100. Further, the control link 1610 could include a combination of wires and wireless mediums.

The remote controller 1605 could comprise a computer running software or a hardwired device that includes permanent memory that is programmed for multiple iterations. The remote controller 1605 could adjust the control range of the phase shifter 110 (not shown) of the variable power divider 100 according to a program or in response to user input. The present invention is not limited to the remote controller 1605 described herein. Other remote controllers 1605 are not beyond the scope and spirit of the present invention.

CONCLUSION

The variable power divider of the present invention provides a device in which the output signals can be easily controlled, either locally or remotely, by a simple, single movable part. The variable power divider of the present invention is suitable for planar construction on a printed circuit board using microstrip or strip line transmission lines. The variable power divider of the present invention has a single input port and at least two output ports where the signals appearing at the output ports are variable in amplitude over a wide range. In one exemplary embodiment, a constant phase difference can exist between the RF signals at the output ports of the variable power divider. In another exemplary embodiment, the RF signals at the output ports of the variable power divider can be substantially equal in phase throughout the adjustment range of the variable adjuster.

The variable amplitudes of the output RF signals produced by the variable power divider of the present invention are accomplished by means of a single moveable part that varies the phase of the input signal, and this single moveable part may be controlled locally or remotely. The variable power divider of the present invention is easily constructed at low cost since it is adaptable to common printed circuit board manufacturing techniques. The variable power divider is also highly reliable by its simplicity of component parts and provides easily variable and repeatable signal outputs.

What is claimed is:

1. A method for providing variable RF power, comprising the steps of:

receiving a RF signal in a moveable electrical path having a range of adjustment;

capacitively coupling the RF signal from the moveable electrical path into two electrical paths having electrical lengths that vary with movement of the moveable electrical path to produce two complementary phase RF signals having substantially equal power and complementary phases throughout the range of adjustment;

recombining the two complementary phase RF signals to produce two output RF signals having complementary power and phases that sum to a substantially a constant quantity throughout the range of adjustment; and moving the moveable electrical path to vary the power of the output RF signals.

2. The method of claim 1, further comprising the step of coupling each output signal to a respective antenna comprising one or more antenna elements to produce an electromagnetic beam having a beam width and direction, wherein the step of moving the moveable electrical path varies the beam width.

3. The method of claim 2, further comprising the step of adjusting the relative phases of the output RF signals.

4. The method of claim 3, wherein the step of adjusting the relative phases of the output RF signals varies the beam direction.

5. The method of claim 1, further comprising the step of remotely activating movement of the moveable electrical path.

6. The method of claim 1, wherein the step of recombining the power further comprises processing the complementary phase RF signals with a hybrid power divider.

7. The method of claim 1, further comprising the steps of:

configuring the movable RF signal path to include a wiper arm trace conductor;

configuring the two electrical paths to include a phrase shifter trace conductor divided by an overlying portion of the wiper are trace conductor; and locating a dielectric spacer located between the phase shifter trace conductor and the wiper arm trace conductor to capacitively couple the trace conductors without direct physical contact between the trace conductors.

8. In or for a wireless communication system, a base station antenna configured to emit or receive a propagating electromagnetic beam, the base station antenna having a variable power divider comprising:

a phase shifter comprising a movable RF signal path capacitively coupling an RF input line to two phase shifter output lines for producing two RF signals having complementary phases that vary with adjustment of the movable RF signal path; and a hybrid power divider having two input lines, each coupled to one of the phase shifter output lines, and two output lines for producing two hybrid power divider output signals having complementary amplitudes that vary with adjustment of the movable RF signal path.

9. The base station antenna of claim 8, wherein the moveable electrical path is adjustable to change the width of the beam.

10. The base station antenna of claim 8, wherein the hybrid power divider comprises a zero degree/ninety degrees power divider and the two hybrid power divider output signals have substantially equal phases.

11. The base station antenna of claim 8, wherein the hybrid power divider comprises a zero degree/one-hundred-eighty degrees power divider and the two hybrid power divider output signals have phases that differ by substantially ninety degrees.

12. The base station antenna of claim 8, wherein:

the movable RF signal path comprises a wiper arm trace conductor;

the two phase shifter output lines comprise a phase shifter trace conductor divided by an overlying portion of the wiper arm trace conductor; and the phase shifter further comprises a dielectric spacer located between the phase shifter trace conductor and the wiper arm trace conductor to capacitively couple the trace conductors without direct physical contact between the trace conductors.

13. A method for operating a wireless communication system base station antenna configured to emit or receive a propagating electromagnetic beam, comprising the steps of:

providing a phase shifter comprising a movable RF signal path capacitively coupling an RF input line to two phase shifter output lines for producing two RF signals having complementary phases that vary with adjustment of the movable RF signal path;

providing a hybrid power divider having two input lines, each coupled to one of the phase shifter output lines, and two output lines for producing two hybrid power divider output signals having complementary amplitudes that vary with adjustment of the movable RF signal path; and moving the movable RF signal path to vary the amplitudes of the hybrid power divider output signals.

14. The method of claim 13, further comprising the step of providing a remotely controlled actuator for moving the moveable RF signal path.

15. The method of claim 13, wherein the step of providing the hybrid power divider comprises the step of providing a zero degree/ninety degrees power divider whereby the hybrid power divider output signals have substantially equal phases.

16. The method of claim 13, wherein the step of providing the hybrid power divider comprises the step of providing a zero degree/one-hundred-eighty degrees power divider whereby the hybrid power divider output signals have phases that differ by substantially ninety degrees.

17. The method of claim 13, further comprising the steps of:

configuring the movable RF signal path to include a wiper arm trace conductor;

configuring the two phase shifter output lines to include a phase shifter trace conductor divided by an overlying portion of the wiper arm trace conductor; and locating a dielectric spaver located between the phase shifter trace conductor and the wiper arm trace conductor to capacity couple the trace conductors without direct physical contact between the trace conductors.

18. The method of claim 13, further comprising the step of coupling each hybrid power divider output signal to a respective antenna comprising one or more antenna elements to produce an electromagnetic beam having a beam width and direction, wherein the step of moving the moveable RF signal path varies the beam width.

19. The method of claim 18, further comprising the step of adjusting the relative phases of the hybrid power divider output signals.

20. The method of claim 19, wherein the step of adjusting the relative phases of the hybrid power divider output signals varies the beam direction.

21. In or for a wireless communication system, a base station antenna having a variable power divider, comprising:

a differential phase shifter having a phase shifter input line, two phase shifter output lines, and operable for capacitively coupling an RF input signal received on the phase shifter input line into complementary phase signals on the phase shifter output lines throughout a range of operation; and a hybrid power divider having a pair of hybrid power divider input lines coupled to the phase shifter output lines, a pair of hybrid power divider output lines, and operable for converting the complementary phase signals received on the hybrid power divider input lines into complementary amplitude signals on the hybrid power divider output lines.

22. The base station antenna of claim 21, wherein the complementary phase signals have substantially equal amplitudes throughout the range of operation.

23. The base station antenna of claim 21, wherein the complementary amplitude signals have substantially equal phases throughout the range of operation.

24. The base station antenna of claim 21, wherein the complementary amplitude signals have phases that are substantially constant with respect to each other throughout the range of operation.

25. The base station antenna of claim 21, wherein the complementary amplitude signals have phases that differ by substantially ninety degrees throughout the range of operation of the variable power divider.

26. The base station antenna of claim 21, further comprising an additional phase shifter operable for adjusting the relative phases of the complementary amplitude signals.

27. The base station antenna of claim 21, wherein the differential phase shifter comprises:

a stationary transmission path segment coupled between the phase shifter output lines;

a wiper arm having a wiper arm input coupled to the phase shifter input line and a wiper arm output movably coupled to the stationary transmission path segment; and an actuator for moving the wiper arm output along the stationary transmission path segment to vary the phases of the complementary phase signals on the phase shifter output lines and thereby vary the amplitudes of the complementary amplitude signals on the hybrid power divider output lines.

28. The base staion antenna of claim 21, wherein:

the phase shifter input line comprise a wiper arm trace conductor;

the two phase shifter output lines comprise a phase shifter trace conductor divided by an overlying portion of the wiper arm trace conductor; and the phase shifter further comprises a dielectric spacer located between the phase shifter trace conductor and the wiper arm trace conductor to capacitively couple the trace conductors without direct physical contact between the trace conductors.

29. In or for a wireless communication system, a base station antenna comprising at least two antenna element arrays each having at least one antenna element, and a variable power divider operable for supplying the antenna element arrays with complementary amplitude signals that can be adjusted relative to one another through operation of the variable power divider, the variable power divider comprising:

a differential phase shifter connected to receive an input signal and capacitively couple the input signal into two phase shifter output signals with substantially equal amplitudes and complementary phase angles, and a hybrid power divider converting the phase shifter output signals to hybrid output signals with relatively fixed predetermined phase angles with respect to one another and amplitudes that differ from one another as a function of the complementary phase angles.

30. The base station antenna of claim 29, wherein the hybrid output signals have substantially equal phases.

31. The base station antenna of claim 29, wherein the hybrid output signals have phases that differ by substantially ninety degrees.

32. The base station antenna of claim 29, further comprising an additional phase adjusting element coupled between at least one output of the hybrid power divider and at least one of the antenna element arrays.

33. The base station antenna of claim 29, wherein the differential phase shifter comprises:

a stationary transmission path segment coupled between the phase shifter output signals;

a wiper arm having a wiper arm input coupled to the phase shifter input signal and a wiper arm output movably coupled to the stationary transmission path segment; and an actuator for moving the wiper arm output along the stationary transmission path segment to vary the phases of the phase shifter output signals and thereby vary the amplitudes of the hybrid output signals.

34. The base station antenna claim 29, wherein:

the input signal is carried on a wiper arm trace conductor;

the two input phase shifter output lines comprise a phase shifter trace conductor divided by an overlying portion of the wiper arm trace conductor; and the phase shifter further comprises a dielectric spacer located between the phase shifter trace conductor and the wiper arm trace conductor to capacitively couple the trace conductor without direct physical contact between the trace conductors.

* * * * *